United States Patent
Yoon et al.

(10) Patent No.: US 7,550,791 B2
(45) Date of Patent: Jun. 23, 2009

(54) TRANSISTOR AND ITS METHOD OF MANUFACTURE

(75) Inventors: Hong-Sik Yoon, Seoul (KR); Young-Moon Choi, Seoul (KR); Sun-Woo Lee, Incheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 131 days.

(21) Appl. No.: 11/832,592

(22) Filed: Aug. 1, 2007

(65) Prior Publication Data

US 2008/0029371 A1 Feb. 7, 2008

(30) Foreign Application Priority Data

Aug. 2, 2006 (KR) .................. 10-2006-0072907

(51) Int. Cl.
*H01L 21/336* (2006.01)
*H01L 21/335* (2006.01)
*H01L 29/786* (2006.01)
*H01L 29/06* (2006.01)

(52) U.S. Cl. .............. 257/213; 257/9; 257/E51.04; 438/268

(58) Field of Classification Search .......... 257/E39.001, 257/E51.038–E51.04, E23.074, E23.165, 257/9, 296, 213; 438/243, 583, 584, 268; 174/256
See application file for complete search history.

(56) References Cited

U.S. PATENT DOCUMENTS

2005/0095780 A1 5/2005 Gutsche et al.

2006/0249726 A1* 11/2006 Choi et al. ............... 257/9

FOREIGN PATENT DOCUMENTS

| EP | 1804286 A1 | 4/2007 |
| EP | 1804286 A1 * | 7/2007 |
| JP | 2004-103802 | 4/2004 |
| KR | 2002-0001260 | 1/2002 |
| KR | 10-2004-0043043 | 5/2004 |

OTHER PUBLICATIONS

English language abstract of Korean Publication No. 2002-0001260.
English language abstract of Japanese Publiction No. 2004-103802.
English language abstract of Korean Publication No. 10-2004-0043043.

* cited by examiner

*Primary Examiner*—Matthew Smith
*Assistant Examiner*—Jessica Hall
(74) *Attorney, Agent, or Firm*—Marger Johnson & McCollom, P.C.

(57) ABSTRACT

An embodiment includes a transistor and a method of manufacturing the transistor that includes carbon nano-tubes. The physical behavior of the carbon nano-tubes, particularly a bending action that alters a normally linear configuration, is affected by elements of the transistor, such as a space between the carbon nano-tube and a conductor. The space is formed by removing a spacer. A dimension of the spacer between the carbon nano-tube and the conductor is efficiently controlled by adjusting its width. An operation voltage of the transistor relates to the physical behavior of the carbon nano-tubes, and thus to the dimensions of the spacer.

20 Claims, 21 Drawing Sheets

TRANSISTOR AND ITS METHOD OF MANUFACTURE

CROSS-REFERENCE TO RELATED APPLICATION

This application claims benefit of priority under 35 U.S.C. § 119 from Korean Patent Application No. 10-2006-0072907 filed on Aug. 2, 2006, in the Korean Intellectual Property Office, the disclosure of which is incorporated herein by reference in its entirety.

BACKGROUND

1. Field of the Invention

Embodiments relates to a transistor and a method of manufacturing the transistor. More particularly, embodiments relates to a transistor including a carbon nano-tube and a method of manufacturing the transistor.

2. Description of the Related Art

A recently discovered method for forming a carbon nano-tube having beneficial properties such as a relatively high electrical conductivity incorporates a chemical vapor deposition (CVD) process. The discovery has triggered research on method of manufacturing a transistor having the carbon nano-tube.

For example, conventional transistors having a carbon nano-tube are disclosed in Japanese Patent Laid-open Publication No. 2004-0103802, Korean Patent Laid-open Publication No. 2002-0001260 and Korean Patent Laid-open Publication No. 2004-0043043.

The transistor employing the carbon nano-tube may have various operation methods. As one example, the transistor may operate by using an elasticity of the carbon nano-tube. Particularly, a state where a carbon nano-tube fixed to a first conductive structure is attached to a second conductive structure, and a state where the carbon nano-tube fixed to the first conductive structure is spaced apart from the second conductive structure are defined as an "on" state and an "off" state, respectively. The transistor may have a switching function by using a difference between the "on" state and the "off" state.

In the above operation method using the elasticity of the carbon nano-tube, a method of forming a space between the second conductive structure and the carbon nano-tube is an important topic of research. Thus, a new method of forming the space has been widely researched.

SUMMARY

An embodiment provides a transistor employing a carbon nano-tube.

Another embodiment provides a method of manufacturing the transistor employing a carbon nano-tube.

In accordance with an embodiment, a transistor includes a first insulating layer pattern, a second conductive structure pattern, a second insulating layer pattern and at least one carbon nano-tube. The first insulating layer pattern is provided on a first conductive structure. The first insulating layer pattern defines a first hole exposing the first conductive structure. The first hole has a first radius. The second conductive structure pattern is provided on the first insulating layer pattern. The second conductive structure pattern defines a second hole communicating with the first hole. The second hole has a second radius substantially larger than the first radius. The second insulating layer pattern is provided on the first insulating layer pattern and the second conductive structure pattern. The second insulating layer pattern defines a third hole communicating with the second hole. The third hole has the second radius. The carbon nano-tube vertically grows from a portion of the first conductive structure exposed through the first hole.

In accordance with an embodiment, a transistor includes a first insulating layer, a second insulating layer pattern, a first conductive structure pattern, a third insulating layer pattern, at least one carbon nano-tube and a second conductive structure. The second insulating layer pattern is provided on the first insulating layer. The second insulating layer pattern defines a first hole exposing the first insulating layer. The first hole has a first radius. The first conductive structure pattern is provided on the second insulating layer pattern. The first conductive structure pattern defines a second hole having a second radius substantially larger than the first radius. The third insulating layer pattern is provided on the second insulating layer pattern and the first conductive structure pattern. The third insulating layer pattern defines a third hole communicating with the first hole. The third hole has a second radius. The carbon nano-tube vertically grows from a portion of the first insulating layer exposed through the first hole. The second conductive structure is provided on the third insulating layer pattern to fix an upper end of the carbon nano-tube.

In accordance with an embodiment, there is provided a method of manufacturing a transistor. In the method, a first insulating layer is formed on a first conductive structure. A second conductive structure is formed on the first insulating layer. A second insulating layer is formed on the first insulating layer and the second conductive structure. The second insulating layer and the second conductive structure are etched to form a second insulating layer pattern and a second conductive structure pattern. The second insulating layer pattern defines a first hole having a first radius. The second conductive structure pattern defines a second hole having the first radius. A spacer is formed on inner walls of the first hole and the second hole. An etching process is performed on the first insulating layer by using the spacer as an etch mask to form a first insulating layer pattern defining a third hole communicating with the second hole. The third hole has a second radius substantially smaller than the first radius. The spacer is removed. At least one carbon nano-tube is allowed to vertically grow from a portion of the first conductive structure exposed through the first hole.

In accordance with an embodiment, there is provided a method of manufacturing a transistor. A first insulating layer and a second insulating layer are subsequently formed. A first conductive structure is formed on the second insulating layer. A third insulating layer is formed on the second insulating layer and the first conductive structure. The third insulating layer and the first conductive structure are etched to form a third insulating layer pattern and a first conductive structure pattern. The third insulating layer pattern defines a first hole having a first radius. The first conductive structure pattern defines a second hole communicating with the first hole. The second hole has the first radius. A spacer is formed on inner walls of the first hole and the second hole. An etching process is performed on the second insulating layer by using the spacer as an etch mask to form a second insulating layer pattern defining a third hole communicating with the second hole. The third hole has a second radius substantially smaller than the first radius. The spacer is removed. At least one carbon nano-tube is allowed to vertically grow from a portion of the first insulating layer exposed through the third hole. A second conductive structure is formed on the third insulating layer pattern to fix an upper end of the carbon nano-tube.

According to the present embodiment, a space between a carbon nano-tube and a conductor is formed by removing a spacer. Thus, a stability of processes may be achieved. In addition, a dimension of the spacer between the carbon nanotube and the conductor may be efficiently controlled by adjusting a width of the spacer. Thus, an operation voltage relating to the dimension of the space may be efficiently controlled.

BRIEF DESCRIPTION OF THE DRAWINGS

The above and other advantages will become readily apparent by reference to the following detailed description when considered in conjunction with the accompanying drawings in which.

DESCRIPTION OF THE EMBODIMENTS

Figure 1:
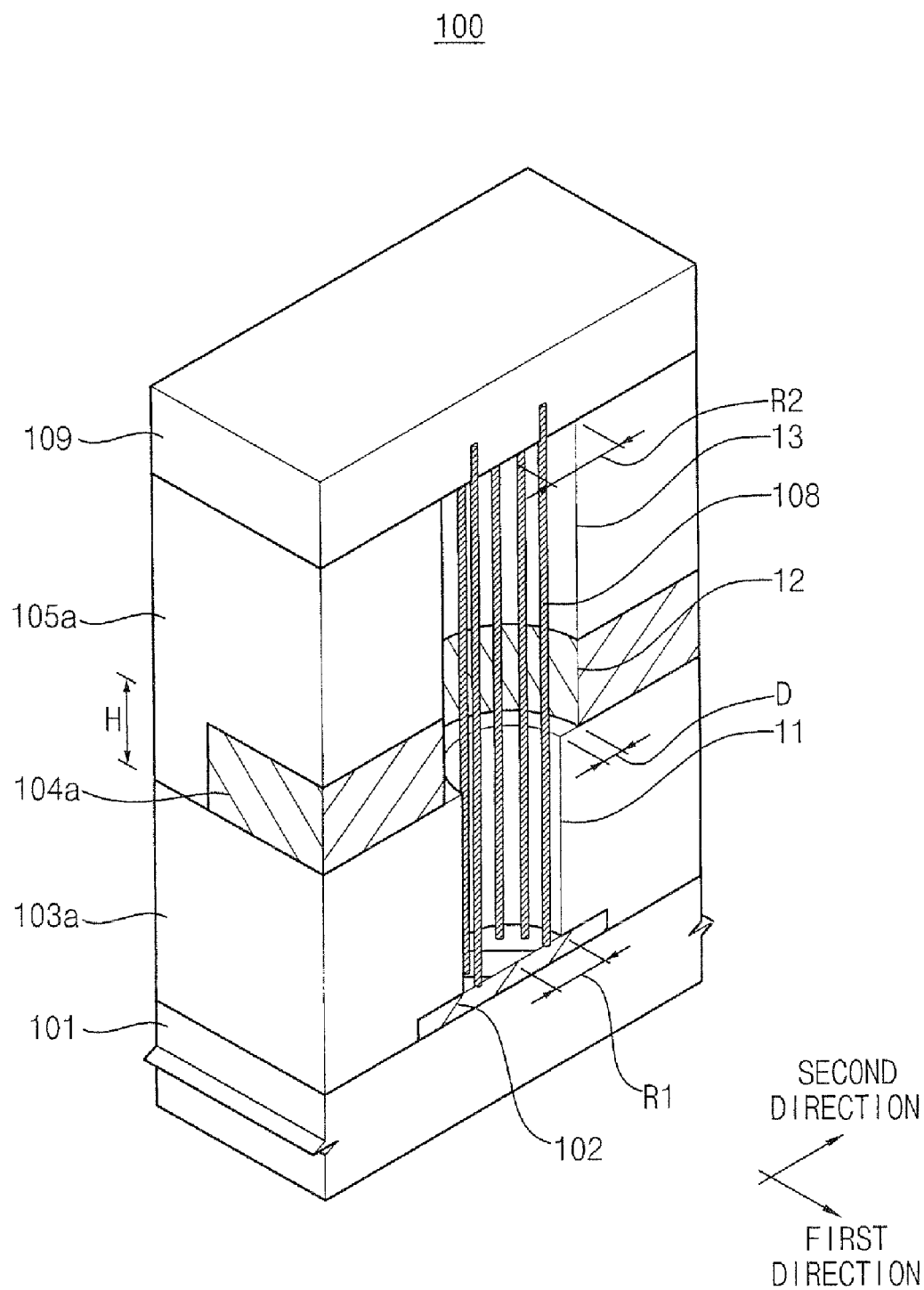
FIG. 1 is a partially cut perspective view illustrating a transistor in accordance with an embodiment.

Embodiments will be described with reference to the accompanying drawings. The present invention may, however, be embodied in many different forms and should not be construed as limited to the embodiments set forth herein. Rather, the embodiments are provided so that disclosure will be thorough and complete, and will fully convey the scope of the present invention to those skilled in the art. The principles and features of this invention may be employed in varied and numerous embodiments without departing from the scope of the present invention. In the drawings, the size and relative sizes of layers and regions may be exaggerated for clarity. The drawings are not necessarily to scale. Like reference numerals designate like elements throughout the drawings.

It will also be understood that when an element or layer is referred to as being "on", "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

FIG. 1 is a partially cut perspective view illustrating a transistor in an embodiment.

Referring to FIG. 1, a transistor 100 includes a first insulating layer 101, a first conductive structure 102, a second insulating layer pattern 103a, a second conductive structure pattern 104a, a third insulating layer pattern 105a, at least one carbon nano-tube 108 and a capping layer 109.

The first insulating layer 101 may include an insulating material such as silicon nitride. The first conductive structure 102 may include a conductive material such as metal, alloy or doped polysilicon. In addition, the first conductive structure 102 may have a substantial line shape extending in a first direction, which is denoted in the figure.

A seed required for growing the carbon nano-tube 108 may be provided on the first conductive structure 102 in this embodiment. The seed may have a substantial film shape, i.e., be relatively thin compared to its horizontal extent. Alternatively, the seed may be particles having nano sizes. For example, the seed may include nickel (Ni), iron (Fe), cobalt (Co), or an alloy of these elements, for example.

The second insulating layer pattern 103a including an insulating material such as silicon oxide is provided on the first insulating layer 101 and the first conductive structure 102. The second insulating layer pattern 103a may define a first hole 11 exposing the first conductive structure 102. The first hole 11 may have a first radius R1.

The second conductive structure pattern 104a may be provided on the second insulating layer pattern 103a. In addition, the third insulating layer pattern 105a including an insulating material such as silicon oxide may be formed on the second insulating layer pattern 103a and the second conductive structure pattern 104a.

The second conductive structure pattern 104a may include a conductive material such as metal, alloy or doped polysilicon. The second conductive structure pattern 104a may extend in a second direction substantially perpendicular to the first direction, as shown in FIG. 1. The second conductive structure pattern 104a may have a predetermined height H.

The second conductive structure pattern 104a may define a second hole 12 communicating with the first hole 11. The second hole 12 may have a second radius R2. The second radius R2 is larger than the first radius R1 by about a predetermined width D.

Figure 2:
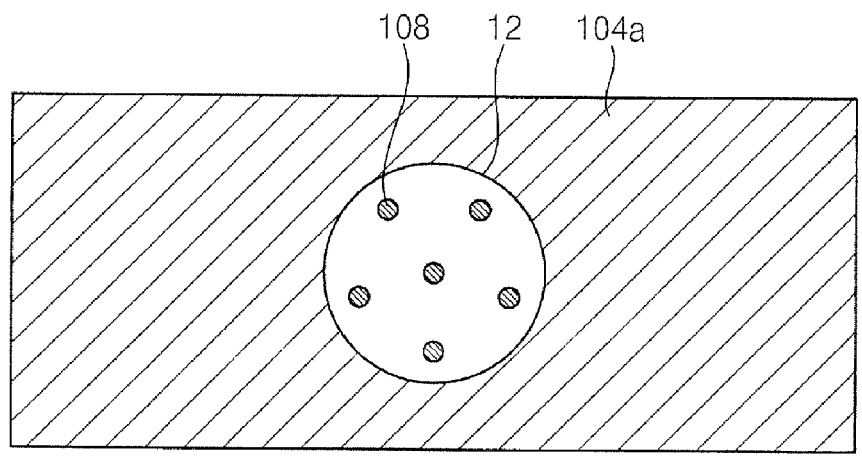
FIGS. 2 and 3 are cross-sectional views of the transistor in FIG. 1 taken in parallel with first and second directions.
Figure 3:
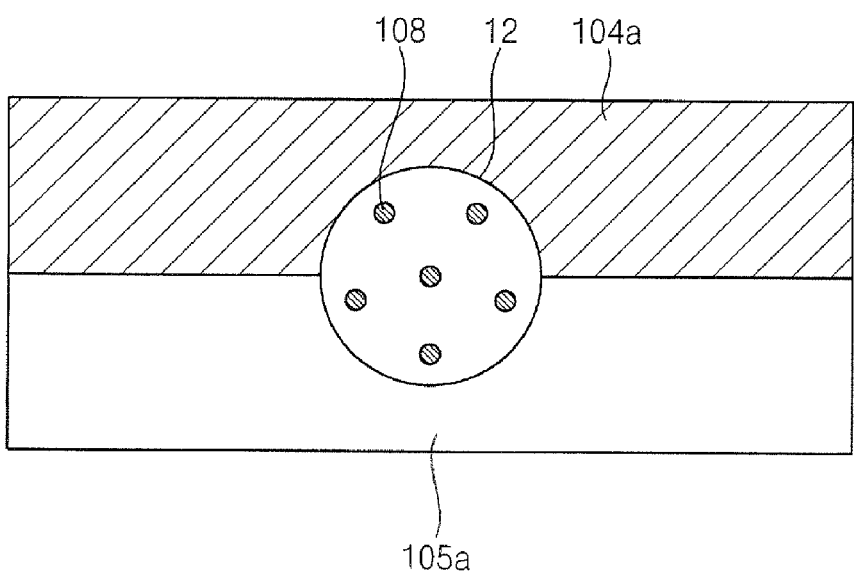

FIGS. 2 and 3 are cross-sectional views of the transistor in FIG. 1 taken in parallel with first and second directions. Particularly, FIGS. 2 and 3 may illustrate locations of the second conductive structure pattern 104a and the second hole 12.

Referring to FIG. 2, the second conductive structure pattern 104a may fully enclose the second hole 12. In this case, the second hole 12 may be provided through a central portion of the second conductive structure pattern 104a.

Alternatively, referring to FIG. 3, the second conductive structure pattern 104a may partially enclose the second hole 12. For example, the second conductive structure pattern 104a may enclose about half the second hole 12. If the second conductive structure pattern 104a partially encloses the second hole 12, then the second conductive structure pattern 104a may have a recessed side portion. In this case, the second conductive structure pattern 104a together with the third insulating layer pattern 105a may define the second hole 12.

If the second conductive structure pattern 104a partially encloses the second hole 12, then a magnetic field generated from the second conductive structure pattern 104a may not disturb a movement of the carbon nano-tube 108 that is subsequently formed.

The third insulating layer pattern 105a may define a third hole 13 communicating with the second hole 12. The third hole 13 may have the second radius R2.

The carbon nano-tube 108 may vertically grow from a portion of the first conductive structure 102 exposed through the hole 11. Here, a height of the carbon nano-tube 108 may be substantially greater than that of the third insulating layer pattern 105a.

The carbon nano-tube 108 may be spaced apart from the second conductive structure pattern 104a by a predetermined width D or more.

The capping layer 109 may be provided on the third insulating layer pattern 105a to fix an upper end of the carbon nano-tube 108. The capping layer may include an insulating material. Here, the capping layer 109 is optional. Thus, the capping layer 109 may not be provided.

Hereinafter, a method of manufacturing the transistor 100 in FIG. 1 is described.

FIGS. 4 to 11 are partially cut perspective views illustrating a method of manufacturing a transistor 100 in FIG. 1.

Figure 4:
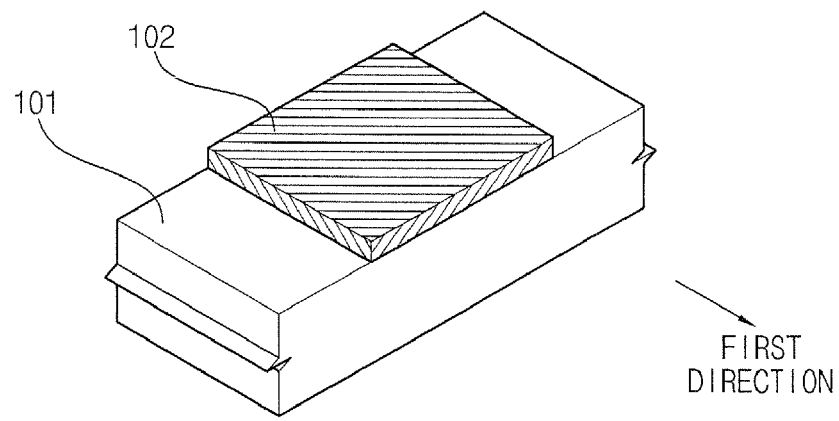
FIGS. 4 to 11 are partially cut perspective views illustrating a method of manufacturing the transistor in FIG. 1.

Referring to FIG. 4, a first insulating layer 101 including an insulating material such as silicon nitride is formed. A first conductive stricture 102 including a conductive material such as metal, alloy or doped polysilicon is then formed on the first insulating layer 101. The first conductive structure 102 may have a substantial line shape extending in a first direction.

A seed (not shown) may be formed on the first conductive structure 102. The seed may be required for allowing a carbon nano-tube to grow. The seed may form substantially in a film. Alternatively, the seed may be particles having nano sizes. The seed may be formed using nickel, iron, cobalt, or an alloy of these elements, for example.

Figure 5:
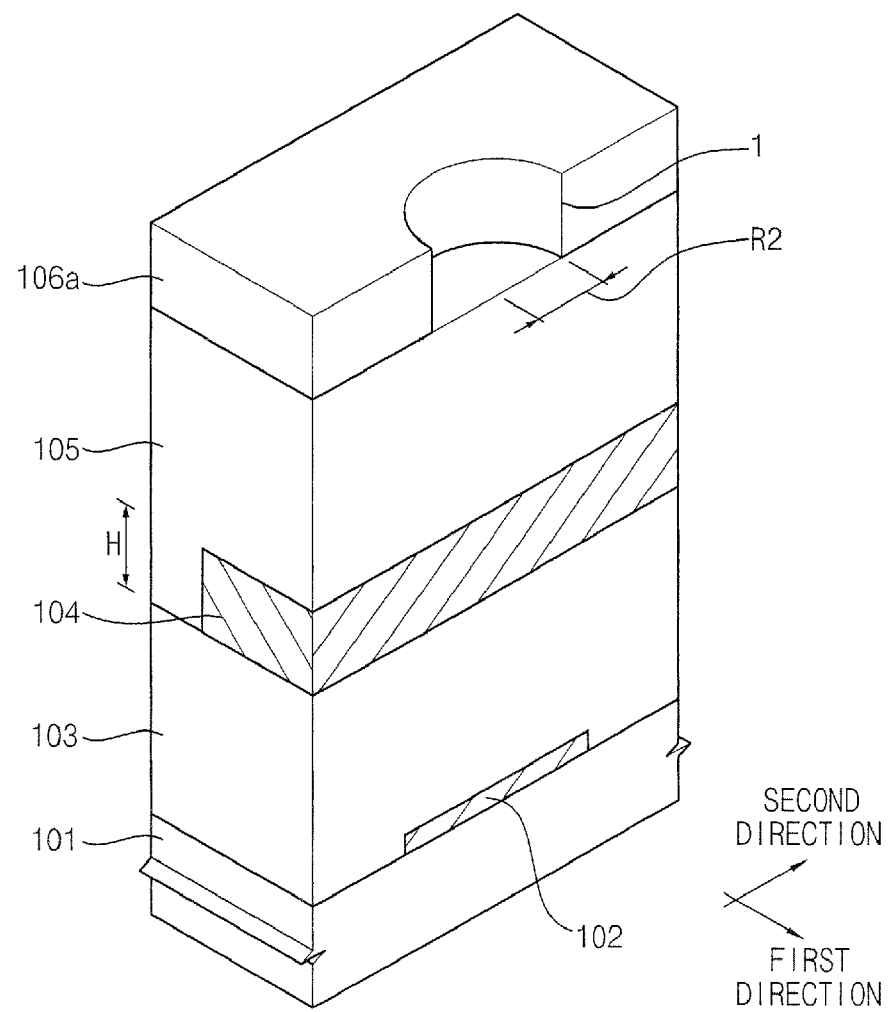

Referring to FIG. 5, a second insulating layer 103 is formed on the first insulating layer 101 and the first conductive structure 102 by using an insulating material such as silicon oxide. Thereafter, a second conductive structure 104 is formed on the second insulating layer 103 by using a conductive material such as metal, alloy or doped polysilicon. The second conductive structure 104 may have a substantial line shape extending in a second direction substantially perpendicular to the first direction.

Here, the second conductive structure 104 may have a predetermined height H. Thereafter, a third insulating layer 105 is formed on the second insulating layer 103 and the second conductive structure 104 by using an insulating material such as silicon oxide.

A mask layer is then formed on the third insulating layer 105 by using an insulating material such as silicon nitride. Thereafter, a photolithography process is performed on the mask layer. Thus, the mask layer may be transformed into a mask layer pattern 106a defining an opening 1. Here, the opening 1 may have a second radius R2.

Figure 6:
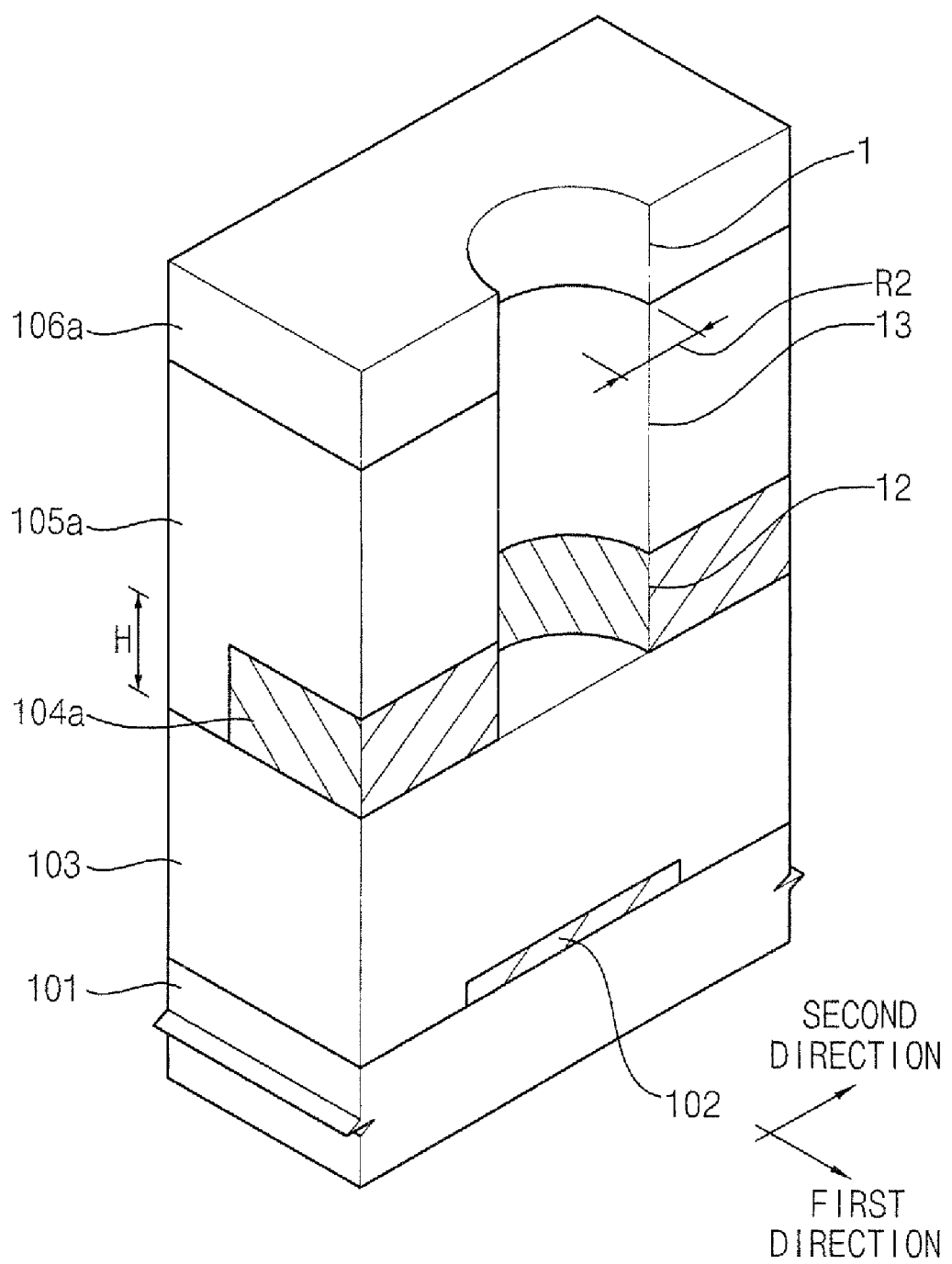

Referring to FIG. 6, the third insulating layer 105 and the second conductive structure 104 are anisotropically etched until the second insulating layer 103 is exposed by using the mask layer pattern 106a as an etch mask. Thus, the third insulating layer 105 and the second conductive structure 104 may be transformed into a third insulating layer pattern 105a and a second conductive structure pattern 104a, respectively.

The third insulating layer pattern 105a may define a third hole 13 communicating with the opening 1. The third hole 13 may have the second radius R2. The second conductive structure pattern 104a may define a second hole 12 communicating with the third hole 13. The second hole 12 may have the second radius R2.

Particularly, the second conductive structure pattern 104a may fully enclose the second hole 12. In this case, the second hole 12 may be formed through a central portion of the second conductive structure pattern 104a.

Alternatively, the second conductive structure pattern 104a may partially enclose the second hole 12. For example, the second conductive structure pattern 104a may enclose about half the second hole 12. In case that the second conductive structure pattern 104a partially encloses the second hole 12, the second conductive structure pattern 104a may have a recessed sidewall. In this case, the second conductive structure pattern 104a and the third insulating layer pattern 105a together may define the second hole 12.

In case that the second conductive structure pattern 104a partially encloses the second hole 12, a magnetic field generated from the second conductive structure pattern 104a may not disturb a movement of the carbon nano-tube subsequently formed.

Figure 7:
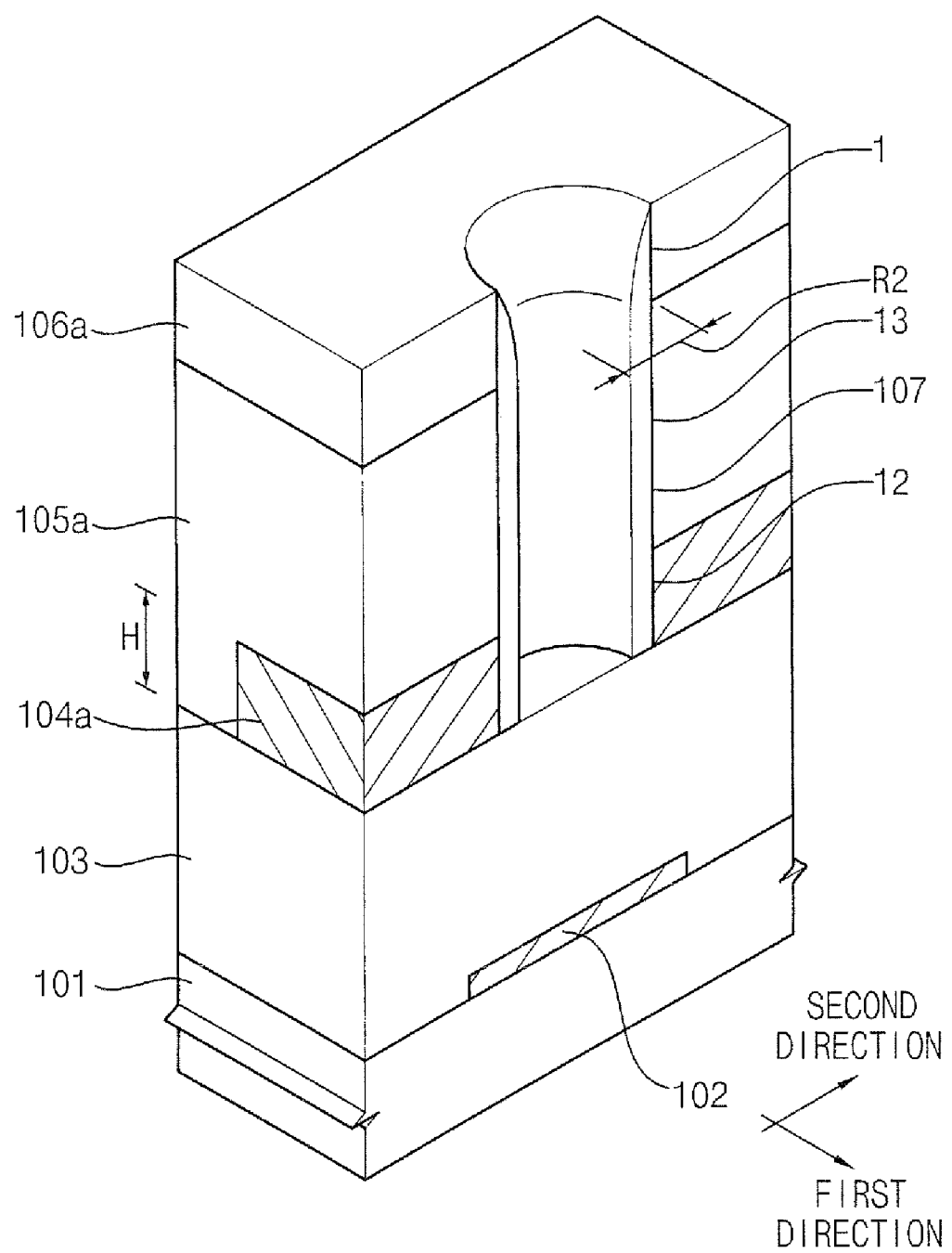

Referring to FIG. 7, an insulating layer (not shown) including an insulating material such as silicon nitride may be formed on the mask layer pattern 106a to fill up the third hole 13 and the second hole 12. Thereafter, the insulating layer may be anisotropically etched. Thus, the insulating layer may be transformed into the spacer 107 located on inner walls of the opening 1, the third hole 13 and the second hole 12. Here, a lower end of the spacer 107 may have a predetermined width D.

Figure 8:
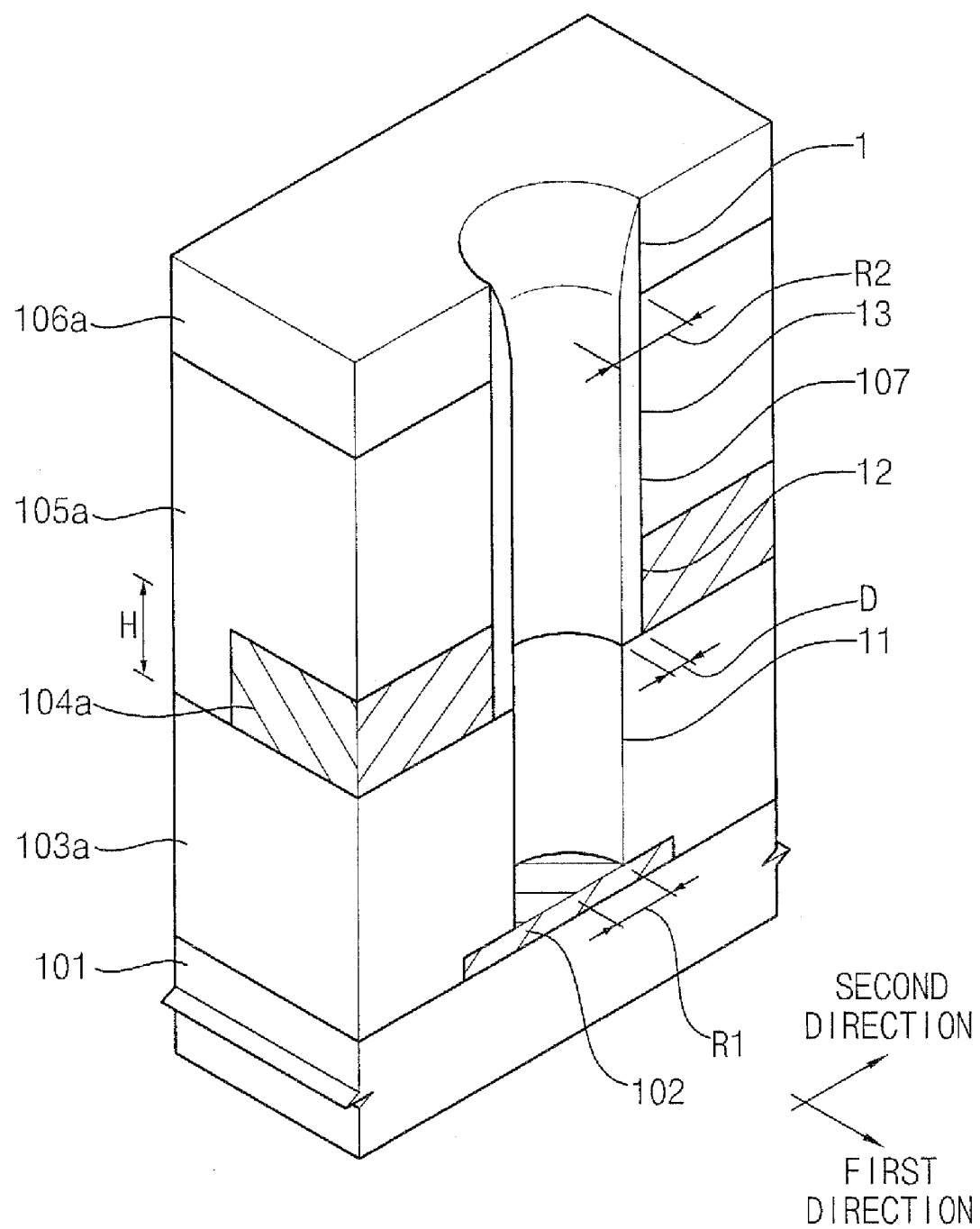

Referring to FIG. 8, the second insulating layer 103 may be anisotropically etched using the mask layer pattern 106a and the spacer 107 together as an etch mask until the first conductive structure 102 is exposed. Thus, the second insulating layer 103 may be transformed into the second insulating layer pattern 103a defining the first hole 11 communicating with the second hole 12. Here, the first hole 11 has a first radius R1 substantially smaller than the second radius R2. Particularly, the first radius R1 may be smaller than the second radius R2 by the width D of the lower end of the spacer 107.

Here, in case that the seed for growing the carbon nano-tube is not formed on the first conductive structure 102 before the second insulating layer 103 is formed, the seed may be formed on a portion of the first conductive structure 102 exposed through the first hole 11.

Figure 9:
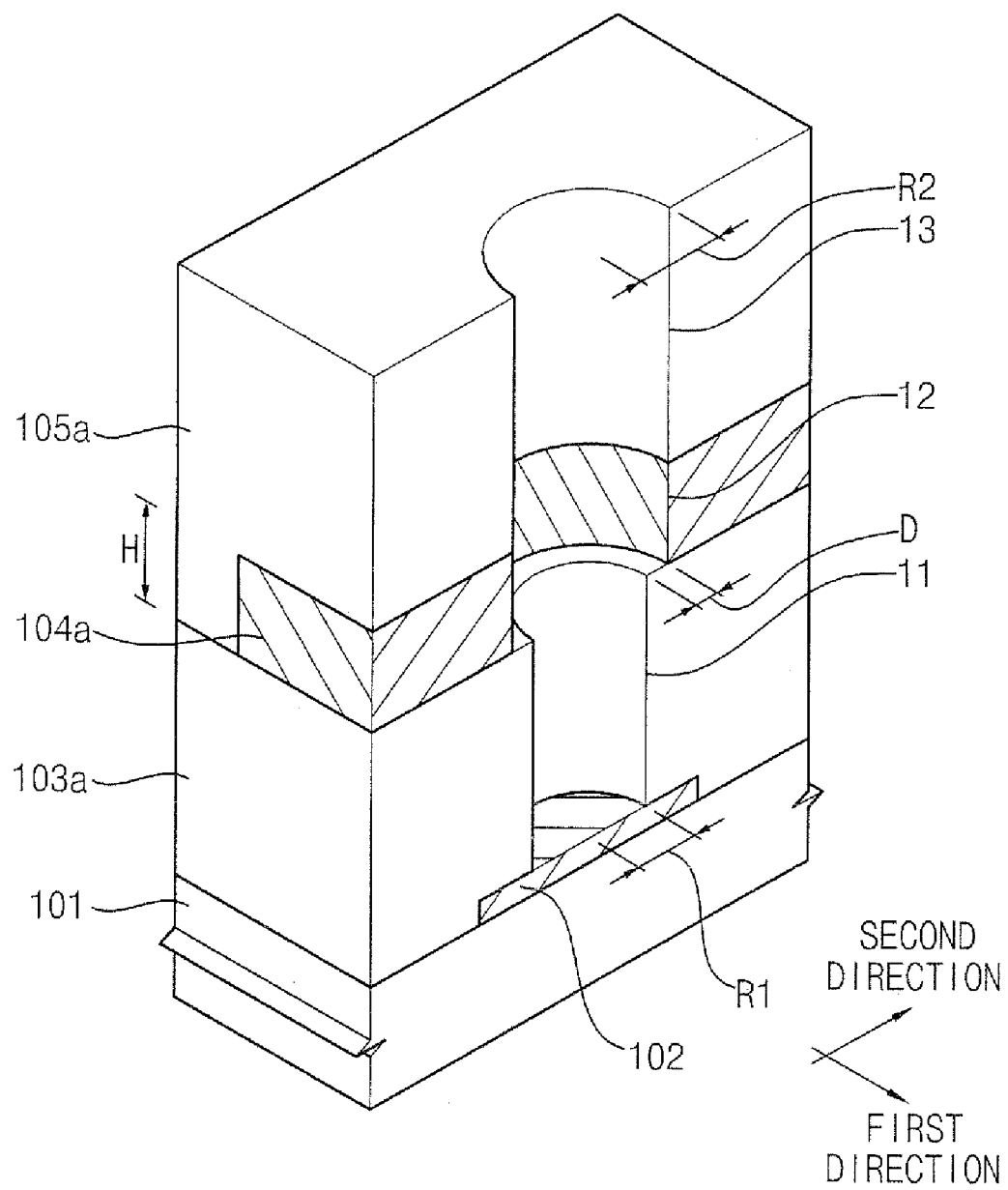

Referring to FIG. 9, the mask layer pattern 106a and the spacer 107 are removed.

Figure 10:
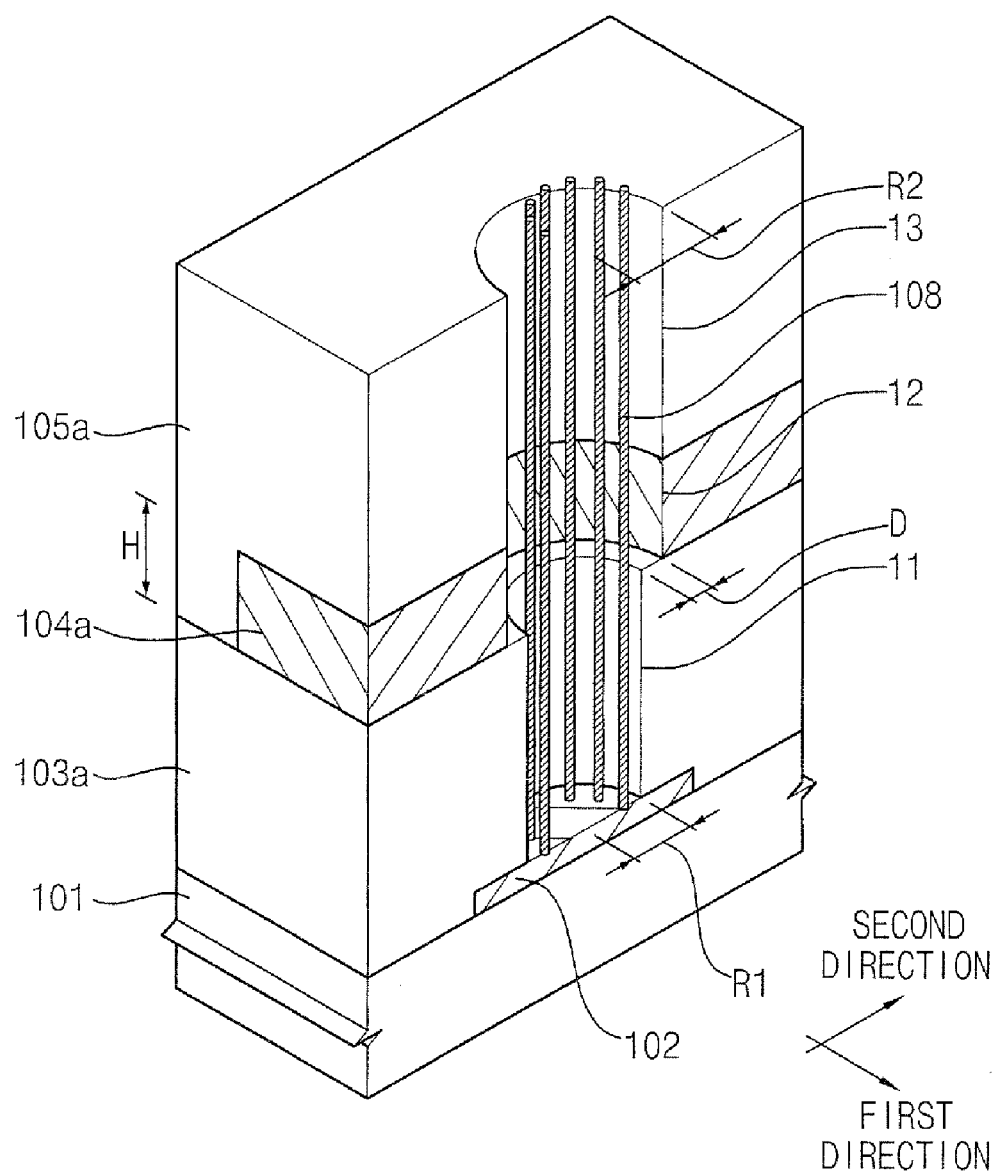

Referring to FIG. 10, at least one carbon nano-tube 108 vertically grows from the portion of the first conductive structure 102 exposed through the first hole 11. Here, a height of the carbon nano-tube 108 may be substantially larger than that of the third insulating layer pattern 105a.

As described above, the spacer 107 is removed before the carbon nano-tube 108 grows. Thus, the carbon nano-tube 108 may be spaced apart from the second conductive structure pattern 104a by the width D of the lower end of the spacer 107.

Figure 11:
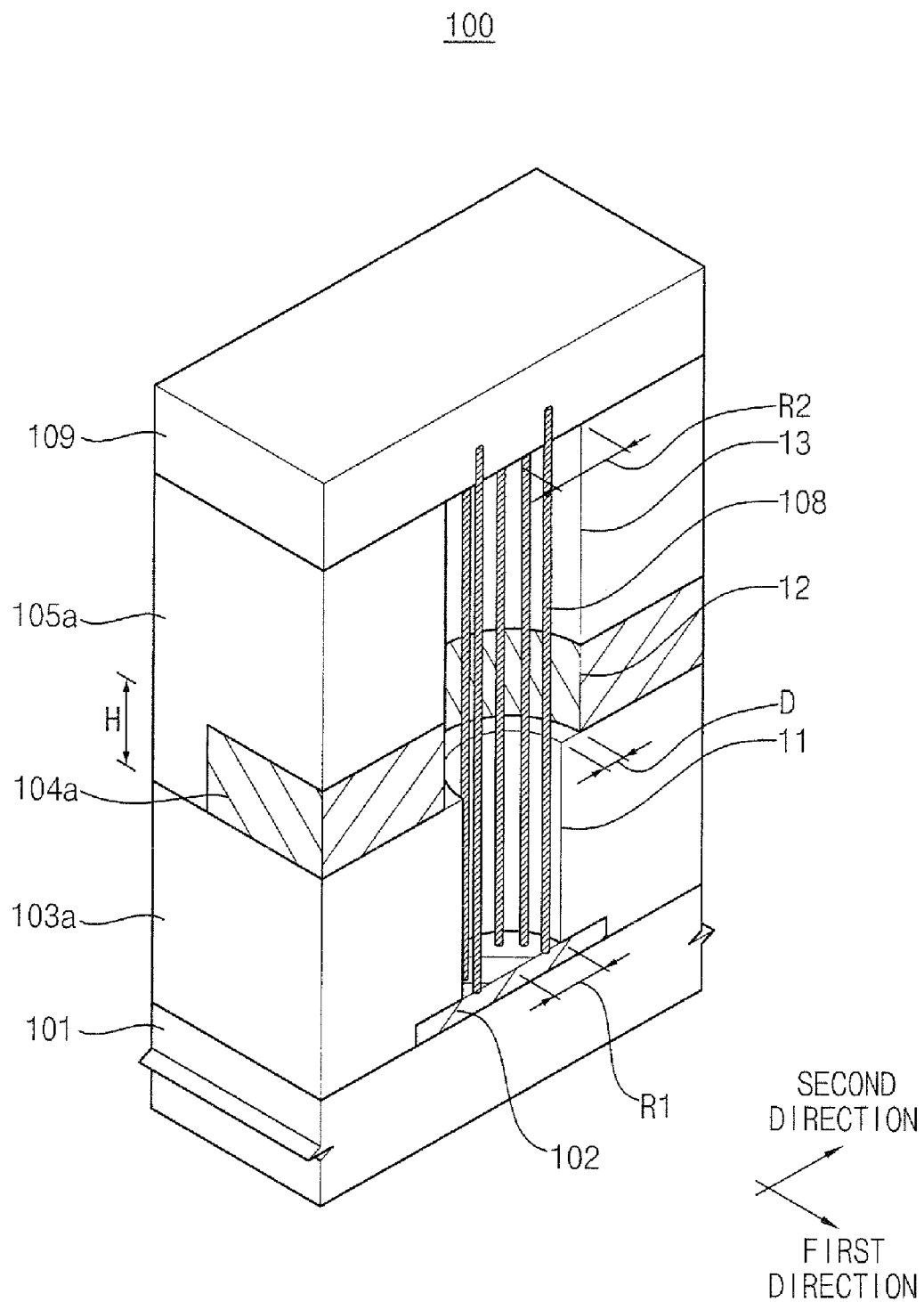

Referring to FIG. 11, a capping layer 109 is formed on the third insulating layer pattern 105a including an insulating material so that a transistor 100 may be manufactured. Here, an upper end of the carbon nano-tube 108 may be fixed to the capping layer 109. The formation of the capping layer 109 is optional. Thus, the capping layer 109 may not be formed.

Hereinafter, an operation of the embodiment of the transistor in FIG. 1 is described.

Figure 12:
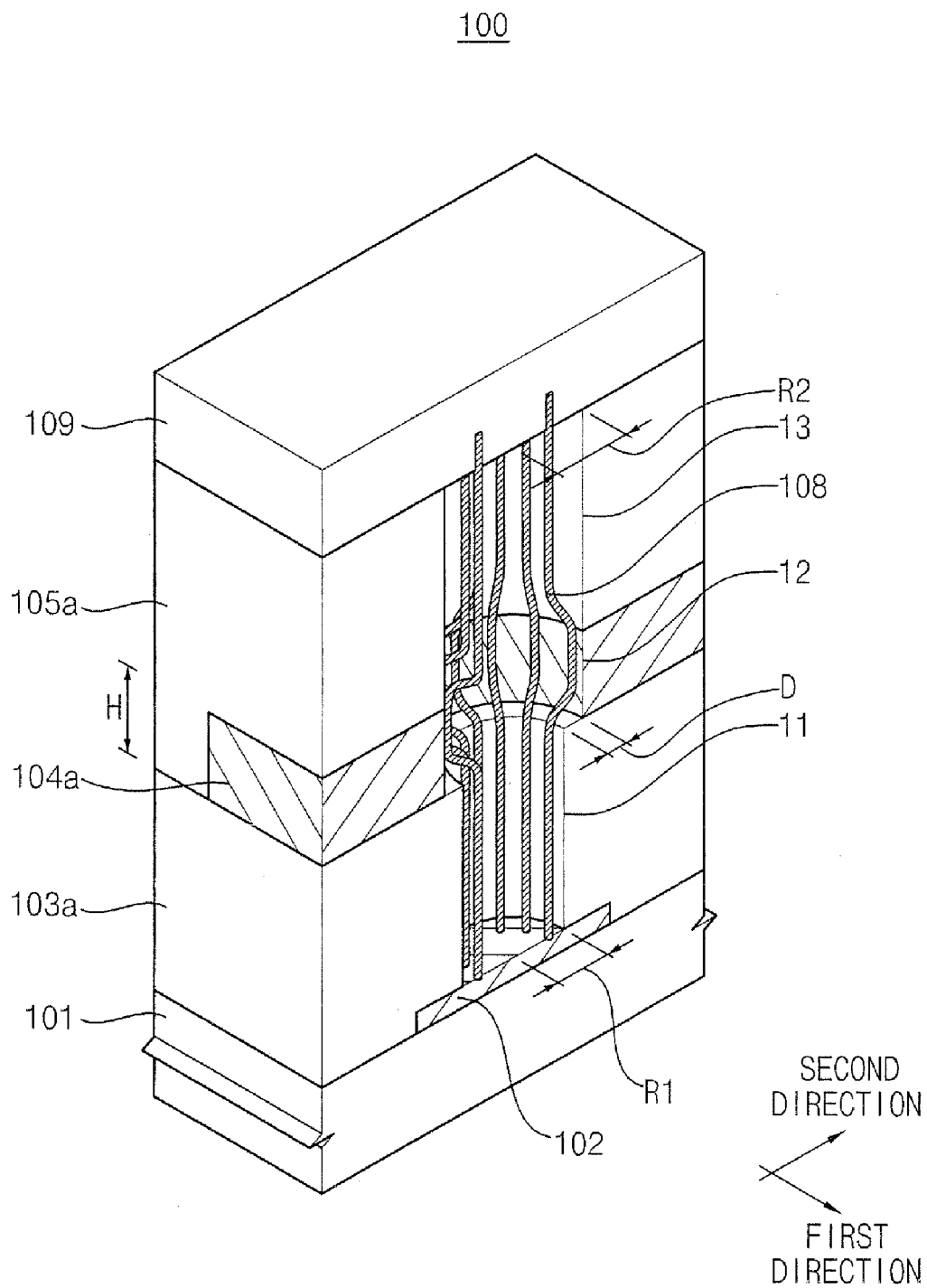
FIGS. 12 to 13 are partially cut perspective views illustrating an operation of the transistor in FIG. 1.
Figure 13:
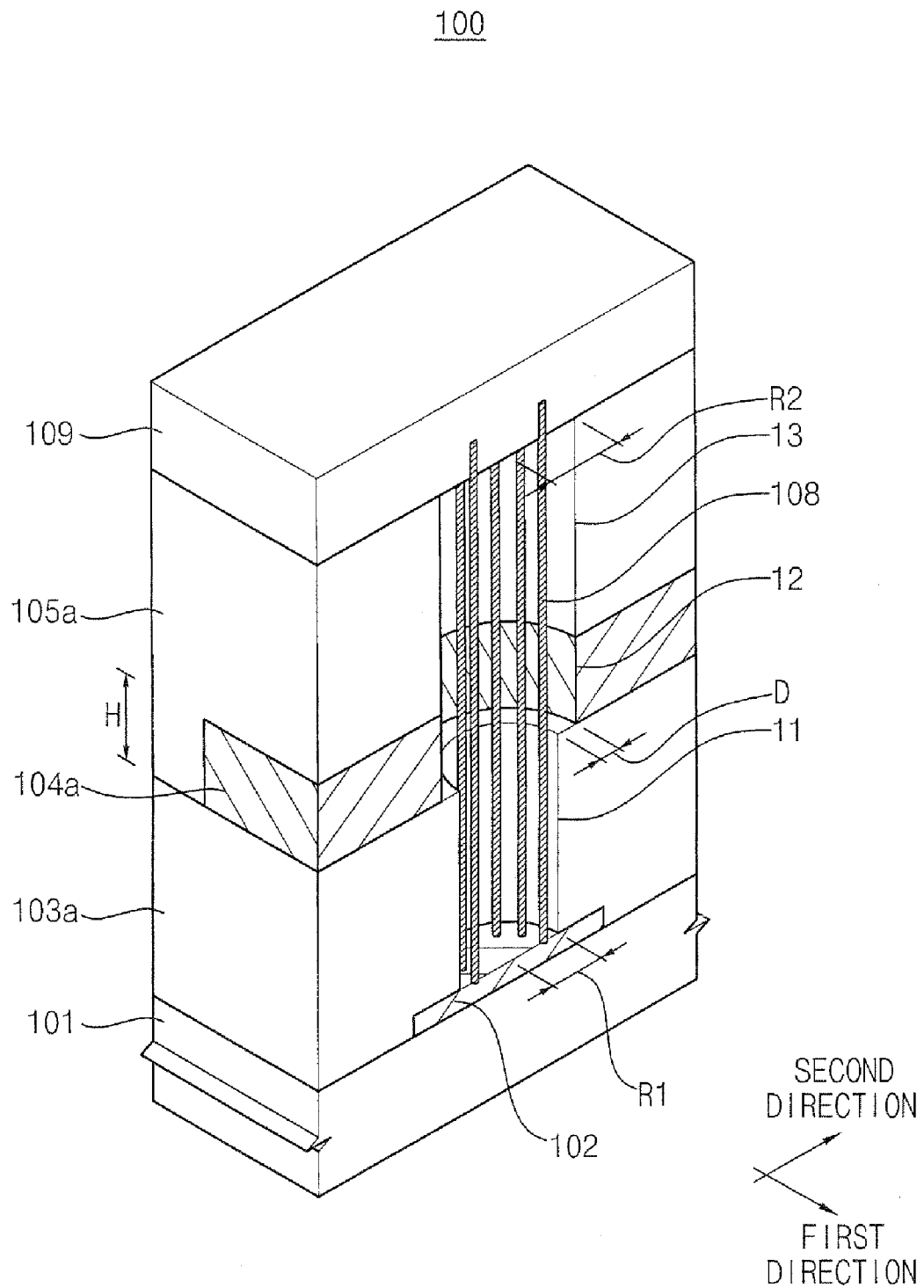

FIGS. 12 to 13 are partially cut perspective views illustrating the operation of the transistor 100 in FIG. 1.

Referring to FIG. 12, different bias voltage polarities may be applied to the first conductive structure 102 and the second conductive structure pattern 104a, respectively. In this case, an electrostatic attraction is generated between the second conductive structure pattern 104a and the carbon nano-tube 108. If the electrostatic attraction is larger than a predetermined energy barrier, then the carbon nano-tube 108 may become connected to the second conductive structure pattern 104a. This state may be defined as an "on" state.

Here, the energy barrier may be determined by not only an inherent elasticity of the carbon nano-tube 108 but also a height H of the second conductive structure pattern 104a, a distance D between the carbon nano-tube 108, the second conductive structure pattern 104a, and so on.

Particularly, the distance D between the carbon nano-tube 108 and the second conductive structure pattern 104a is the width D (or slightly greater, because of the distance between the carbon nano-tube 108 and the inside surface of the first hole 11) of the lower end of the spacer 107. Thus, the operation voltage of the transistor 100 may be effectively adjusted by controlling a formation of the spacer 107.

Referring to FIG. 13, bias voltages having the same polarity may be applied to the first conductive structure 102 and the second conductive structure pattern 104a, respectively. In this case, an electrostatic repulsion may be generated between the carbon nano-tube 108 and the second conductive structure pattern 104a. If the electrostatic repulsion is larger than the inherent elasticity of the carbon nano-tube 108, then the carbon nano-tube 108 may be determinately spaced apart from the second conductive structure pattern 104a. This state may be defined as an "off" state. The transistor 100 may have a switching function by using a difference between the "on" state and the "off" state.

Figure 14:
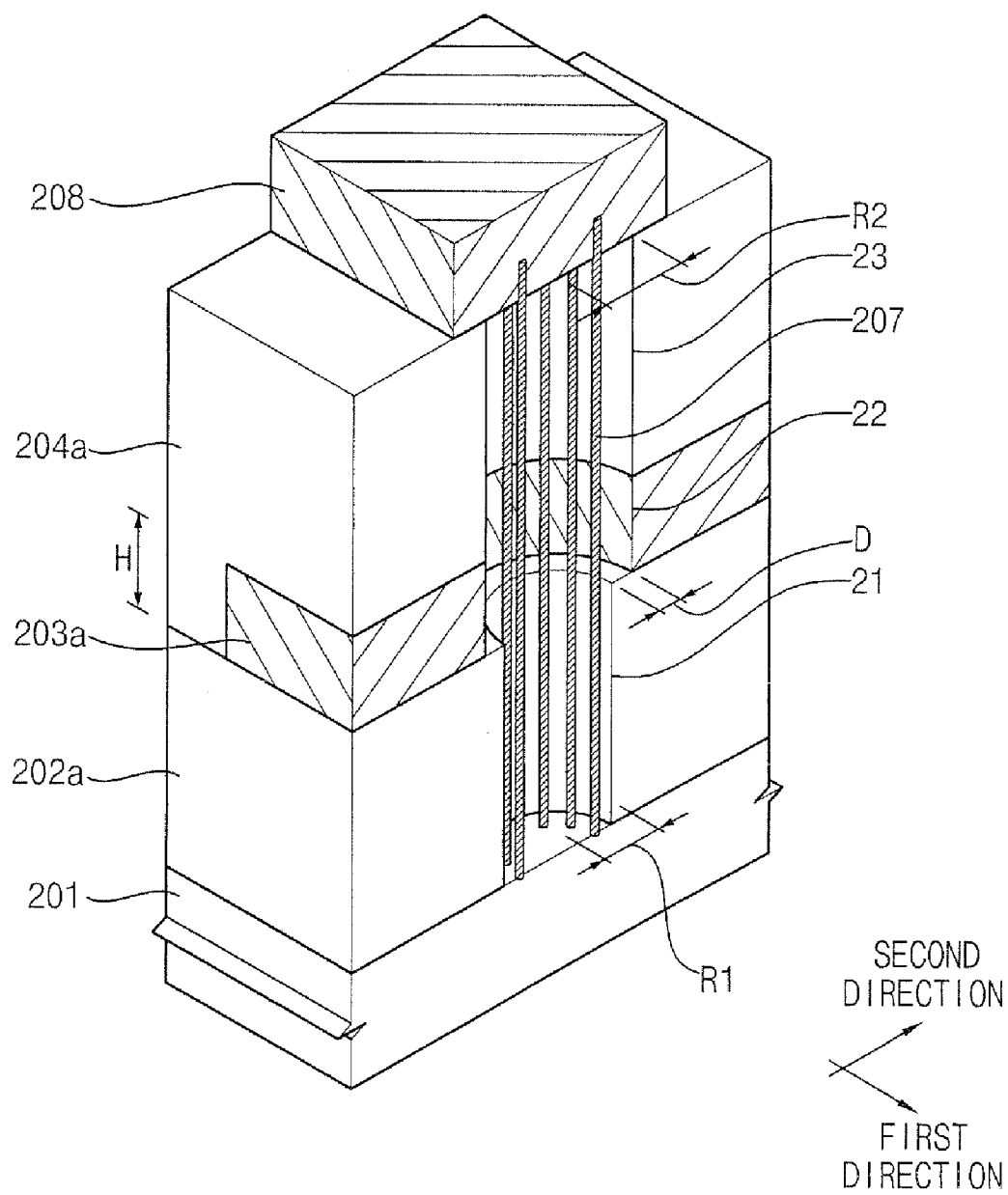
FIG. 14 is a partially cut perspective view illustrating a transistor in accordance with an embodiment.

FIG. 14 is a partially cut perspective view illustrating a transistor in accordance with another embodiment.

Briefly, a principal difference between the last described embodiment and the following embodiment is the "inversion" of the two conductive structures. In the last embodiment, the first conductive structure 102 is below the second conductive structure pattern 104a. In the following embodiment, this scheme is inverted. Details now follow.

Referring to the embodiment of FIG. 14, a transistor 200 may include a first insulating layer 201, a second insulating layer pattern 202a, a first conductive structure pattern 203a, a third insulating layer pattern 204a, at least one carbon nano-tube 207, and a second conductive structure 208.

The first insulating layer 201 may include an insulating material such as silicon nitride. A seed (not shown) may be formed on the first insulating layer 201. The seed is required for allowing a carbon nano-tube to grow. The seed may be shaped substantially in a film. Alternatively, the seed may include nano-sized particles. The seed may include nickel, iron, cobalt, or an alloy of the metals, for example.

The second insulating layer pattern 202a is provided on the first insulating layer 201. The second insulating layer pattern 202a may include an insulating material such as silicon oxide. The second insulating layer pattern 202a may define a first hole exposing the first insulating layer 201. The first hole has a first radius.

The first conductive structure pattern 203a is provided on the second insulating layer pattern 202a, and may include a conductive material such as a metal, alloy, or doped polysilicon. The third insulating layer pattern 204a, which may include an insulating material such as silicon oxide, is provided on the second insulating layer pattern 202a and the first conductive structure pattern 203a.

The first conductive structure pattern 203a may have a line shape extending in the first direction, as indicated in the figure. The first conductive structure pattern 203a may define a second hole 22 communicating with the first hole 23. The second hole 22 may have a second radius R2 larger than the first radius R1 by a predetermined width D.

Particularly, the first conductive structure pattern 203a may fully enclose the second hole 22. In this case, the second hole 22 may be provided through a central portion of the first conductive structure pattern 203a.

Alternatively, the first conductive structure pattern 203a may only partially enclose a lower portion of the second hole 22. For example, the first conductive structure pattern 203a may enclose about half the lower portion of the second hole 22. If the first conductive structure pattern 203a only partially encloses the lower portion of the second hole 22, then the first conductive structure pattern 203a may have a recessed side portion. In this case, the first conductive structure pattern 203a and the third insulating layer pattern 204a together may define the second hole 22.

If the first conductive structure pattern 203a partially encloses the second hole 22, then a magnetic field generated from the first conductive structure pattern 203a may not affect a movement of the carbon nano-tube that is subsequently formed.

The third insulating layer pattern 204a defines a third hole 23 communicating with the second hole 22. The third hole 23 may also have the second radius R2.

The carbon nano-tube 207 may be vertically grown from a portion of the first insulating layer 201 exposed through the first hole 21. Here, a height of the carbon nano-tube 207 may be substantially larger than that of the third insulating layer pattern 204a. The carbon nano-tube 207 may be spaced apart from the first conductive structure pattern 203a by a predetermined width D.

The second conductive structure 208 is provided on the third insulating layer pattern 204a, and may include a conductive material such as a metal, alloy, or doped polysilicon. The second conductive structure 208 extends in a second direction substantially perpendicular to the first direction, as indicated in the figure. Here, an upper end of the carbon nano-tube 207 is fixed to the second conductive structure 208.

Hereinafter, a method of manufacturing the transistor 200 in FIG. 14 is described in FIGS. 15 to 21, which show partially cut perspective views.

Figure 15:
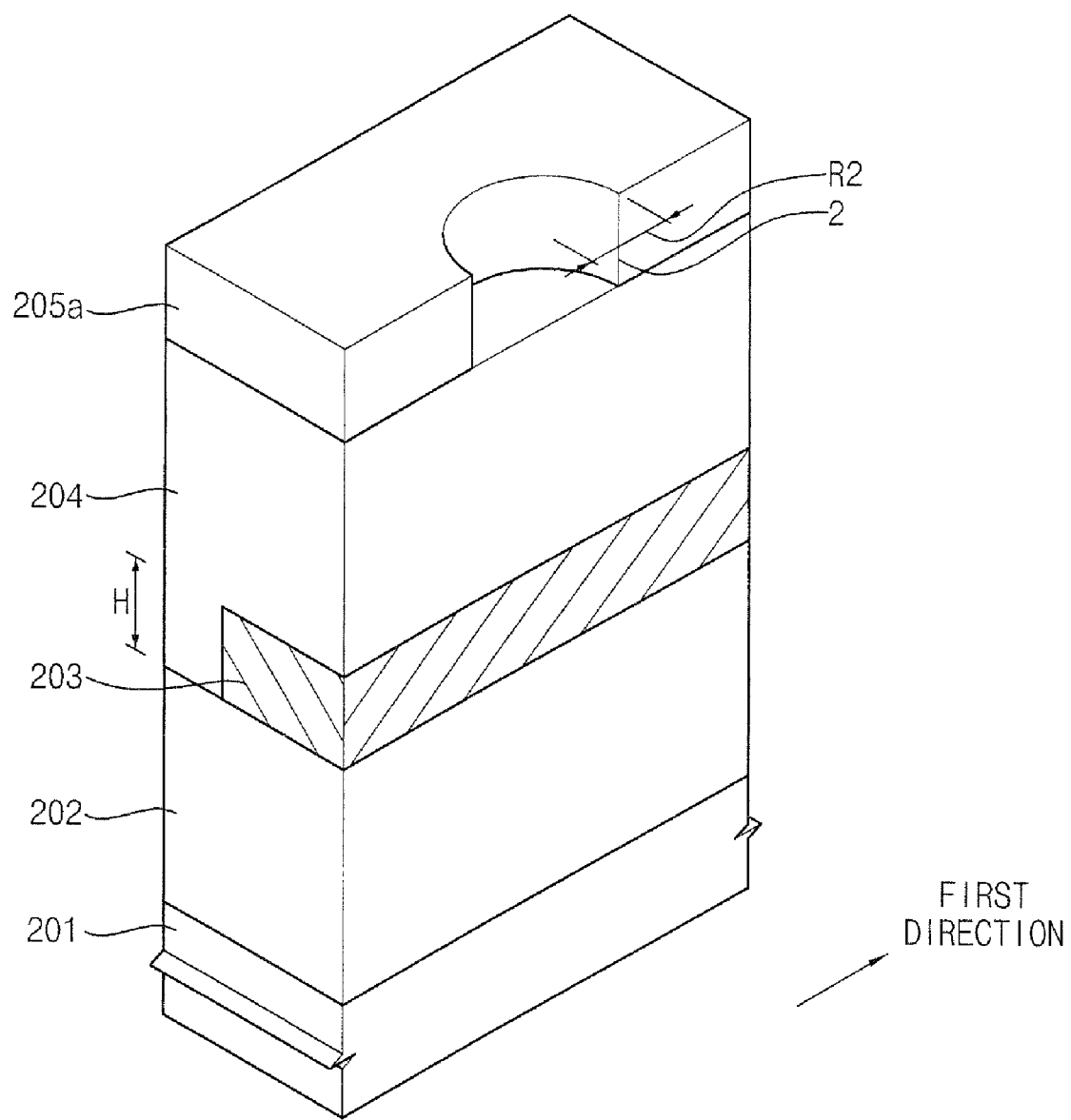
FIGS. 15 to 21 are partially cut perspective views illustrating a method of manufacturing the transistor in FIG. 14.

Referring to FIG. 15, a first insulating layer 201 is formed using an insulating material such as silicon nitride. Here, a seed (not shown) may be formed on the first insulating layer 201. The seed is required for allowing a carbon nano-tube to grow. The seed may be substantially film-shaped. Alternatively, the seed may be nano-sized particles.

Thereafter, a second insulating layer 202 is formed on the first insulating layer 201 by using an insulating material such as silicon oxide. A first conductive structure 203 is formed on the second insulating layer 202. The first conductive structure 203 extends in a first direction. The first conductive structure 203 may include a conductive material such as metal, alloy, or doped polysilicon.

A third insulating layer 204 is then formed on the second insulating layer 202 and the first conductive structure 203 by using an insulating material such as silicon oxide. Thereafter, a mask layer is formed on the third insulating layer 204 by using an insulating material. A photolithography process is then performed on the mask layer. Thus, the mask layer is transformed into a mask layer pattern 205a having an opening 2. Here, the opening 2 has a second radius R2.

Figure 16:
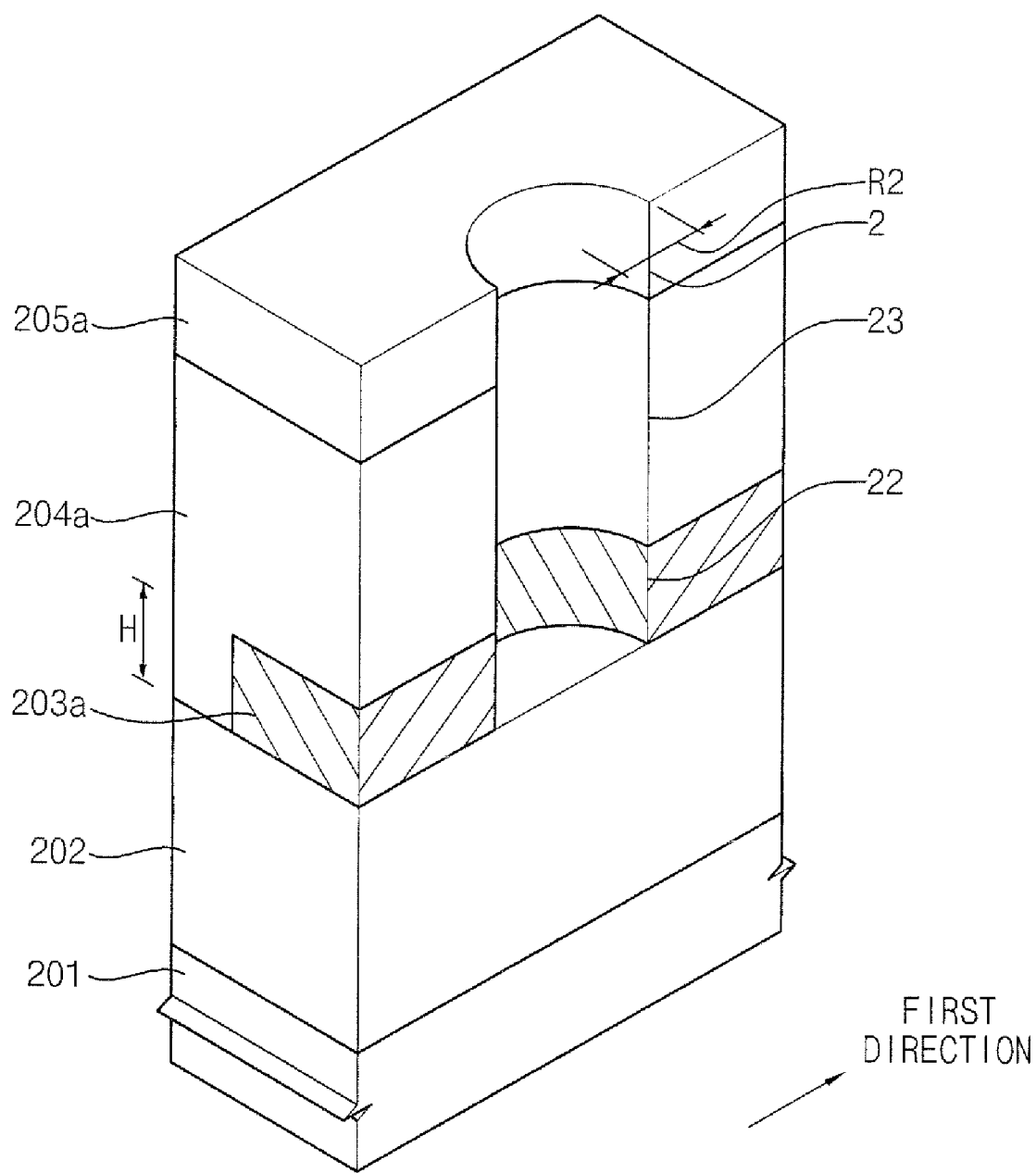

Referring to FIG. 16, the third insulating layer 204 and the first conductive structure 203 are anisotropically etched using the mask layer pattern 205a as an etch mask until the second insulating layer 202 is exposed. Thus, the third insulating layer 204 and the first conductive structure 203 are transformed into a third insulating layer pattern 204a and a first conductive structure pattern 203a. Here, the third insulating layer pattern 204a may define a third hole 23 communicating with the opening 2. The third hole 23 has the second radius R2. The first conductive structure pattern 203a defines a second hole 22 communicating with the third hole 23. The second hole 22 has the second radius R2.

Particularly, the first conductive structure pattern 203a may fully enclose the second hole 22. In this case, the second hole 22 may be formed through a central portion of the first conductive structure pattern 203a.

Alternatively, as mentioned earlier, the first conductive structure pattern 203a may only partially enclose a lower portion of the second hole 22.

Figure 17:
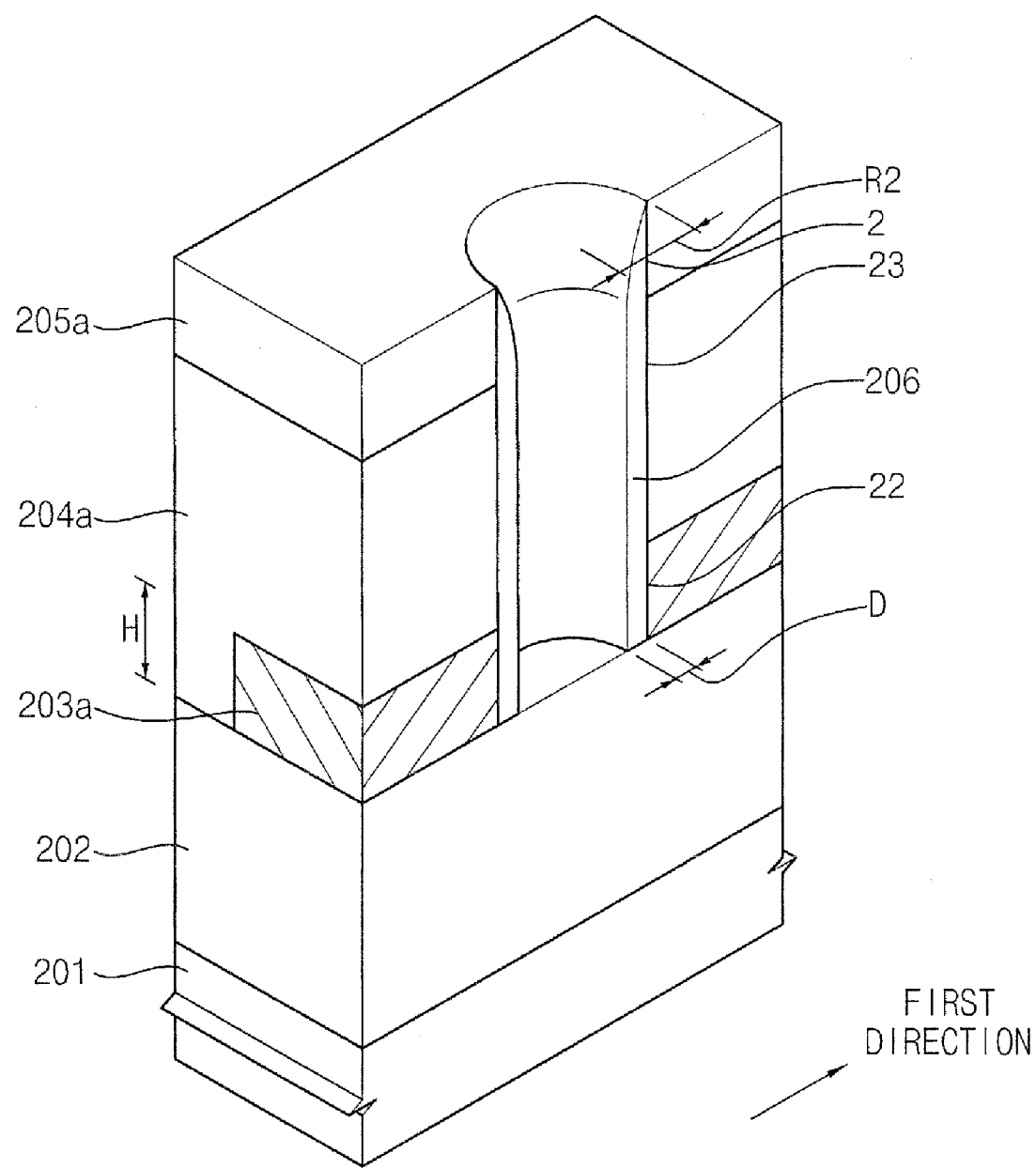

Referring to FIG. 17, an insulating layer (not shown) including an insulating material such as silicon nitride may be formed on the mask layer pattern 205a to fill the third hole 23 and the second hole 22. Thereafter, the insulating layer is anisotropically etched. Thus, the insulating layer may be transformed into a spacer 206 located on inner walls of the third hole 23 and the second hole 22. Here, a lower end of the spacer 206 may have a predetermined width.

Figure 18:
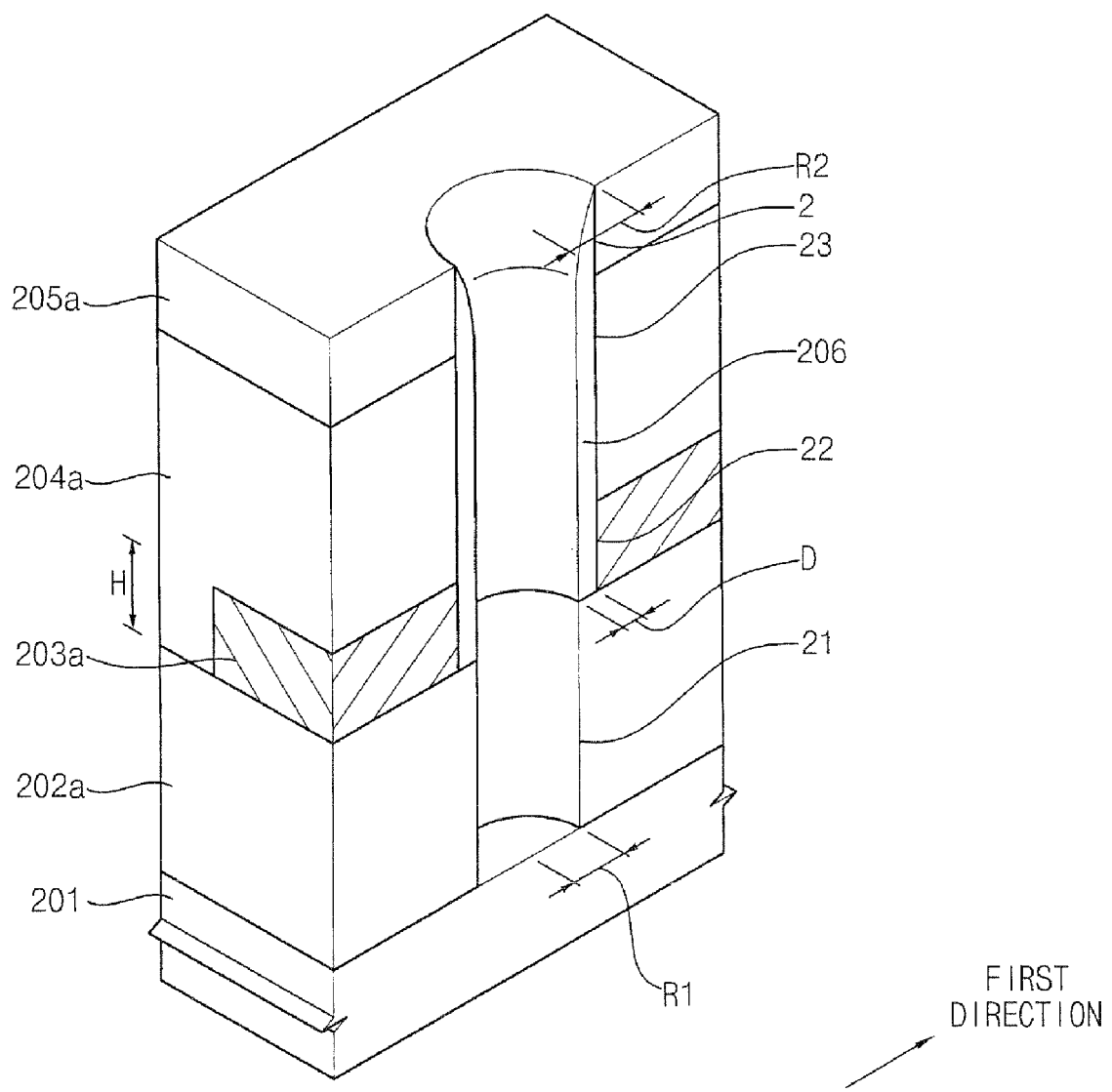

Referring to FIG. 18, the second insulating layer 202 is anisotropically etched using the mask layer pattern 205a and the spacer 206 as an etch mask until the first insulating layer 201 is exposed. Thus, the second insulating layer 202 may be transformed into a second insulating layer pattern 203a having a first hole 21 communicating with the second hole 22. Here, the first hole 21 may have a first radius R1 substantially smaller than the second radius R2. Particularly, the first radius R1 may be smaller than the second radius R2 by a width D of the lower end of the spacer 206.

Here, if the seed for growing the carbon nano-tube is not formed on the first conductive structure 201 before the second insulating layer 202 is formed, then the seed may be formed on a portion of the first conductive structure 201 exposed through the first hole 21.

Figure 19:
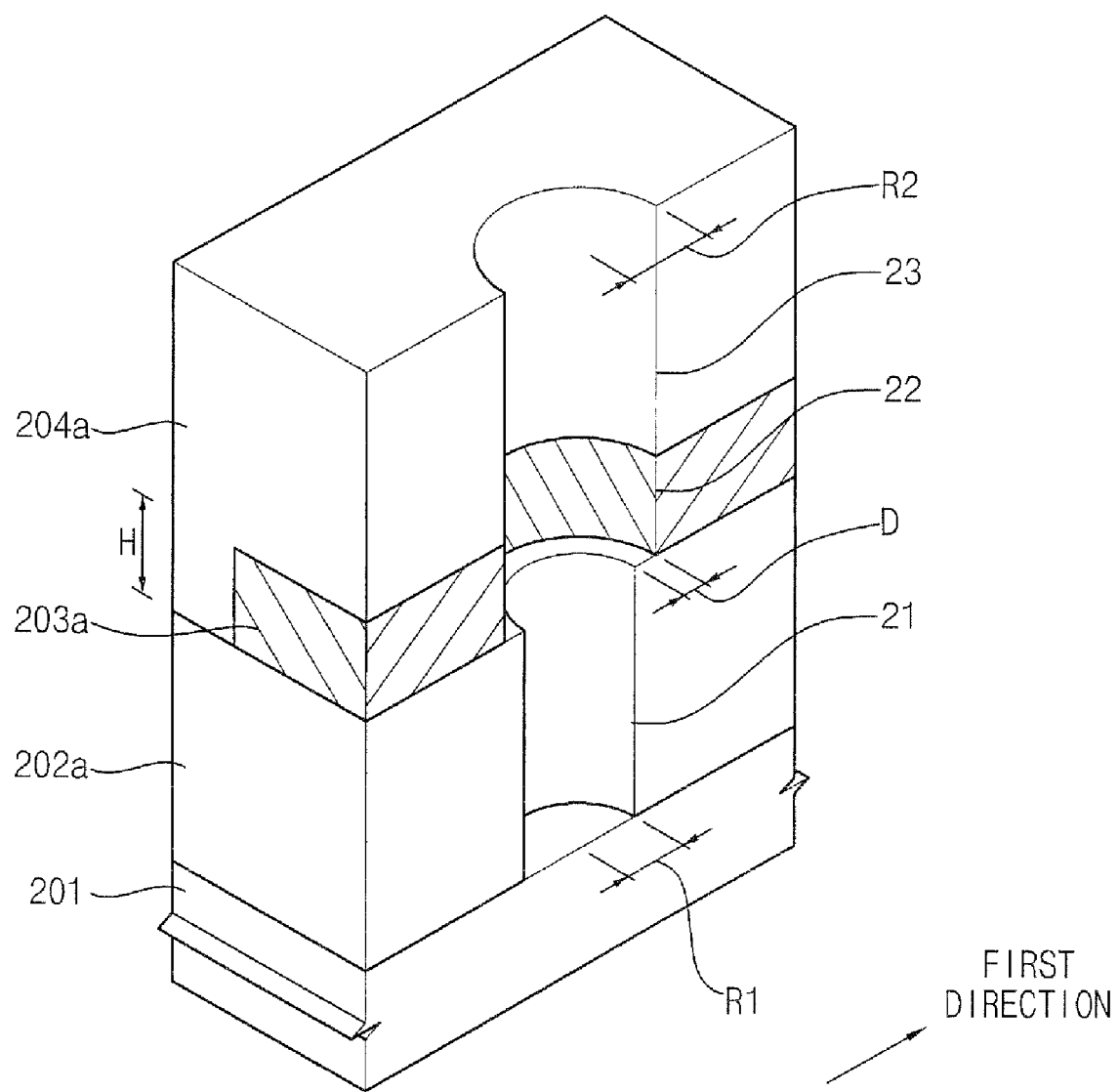

Referring to FIG. 19, the mask layer pattern 205a and the spacer 206 are removed.

Figure 20:
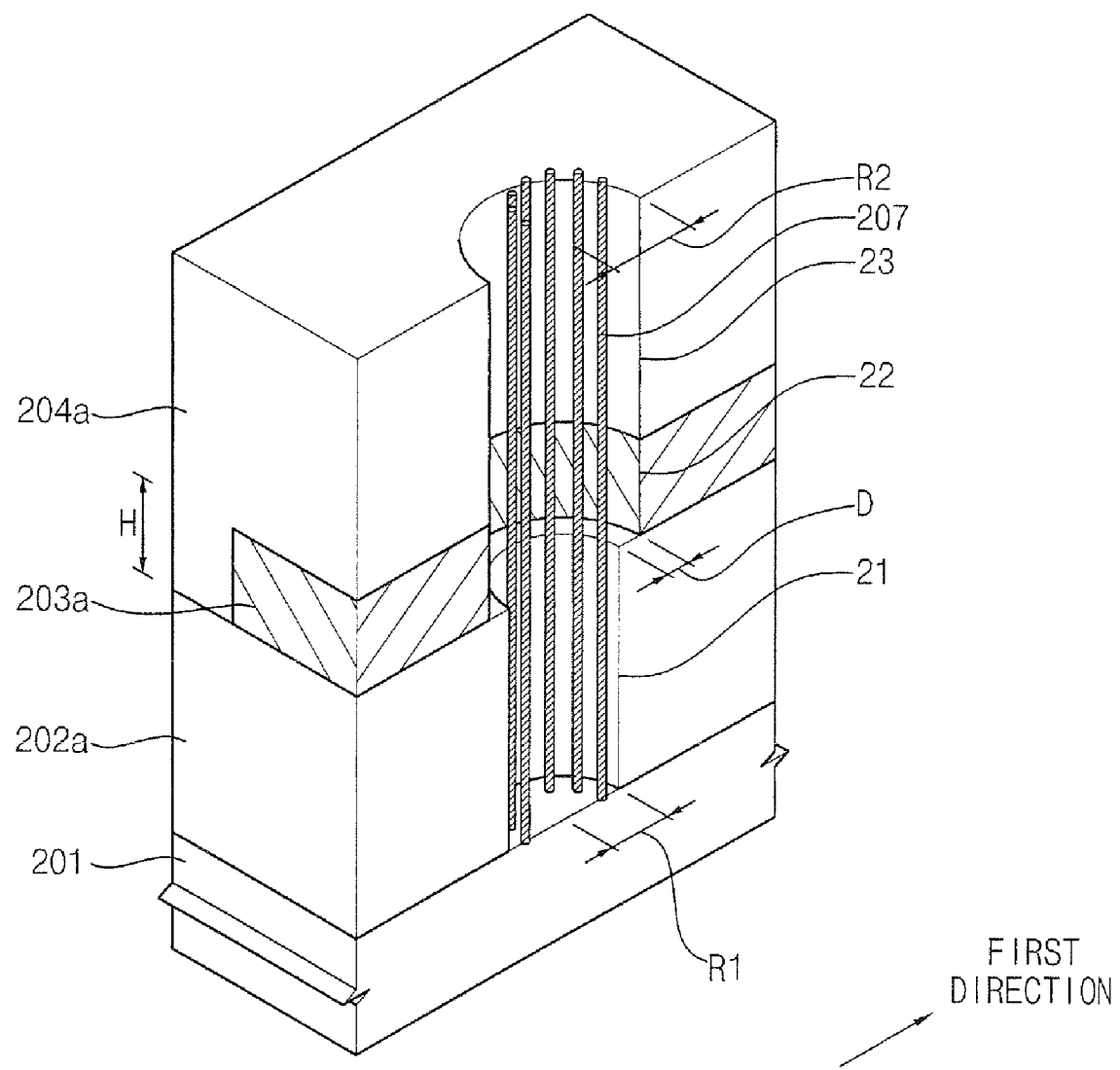

Referring to FIG. 20, at least one carbon nano-tube 207 is vertically grown from the portion of the first conductive structure 201 exposed through the third hole 23. Here, a height of the carbon nano-tube 207 may be substantially larger than that of the third insulating layer pattern 204a.

As described above, the spacer 206 is removed before growing the carbon nano-tube 207. Thus, the carbon nano-tube 207 may be spaced apart from the first conductive structure pattern 203a by the width D of the lower end of the spacer 206.

Figure 21:
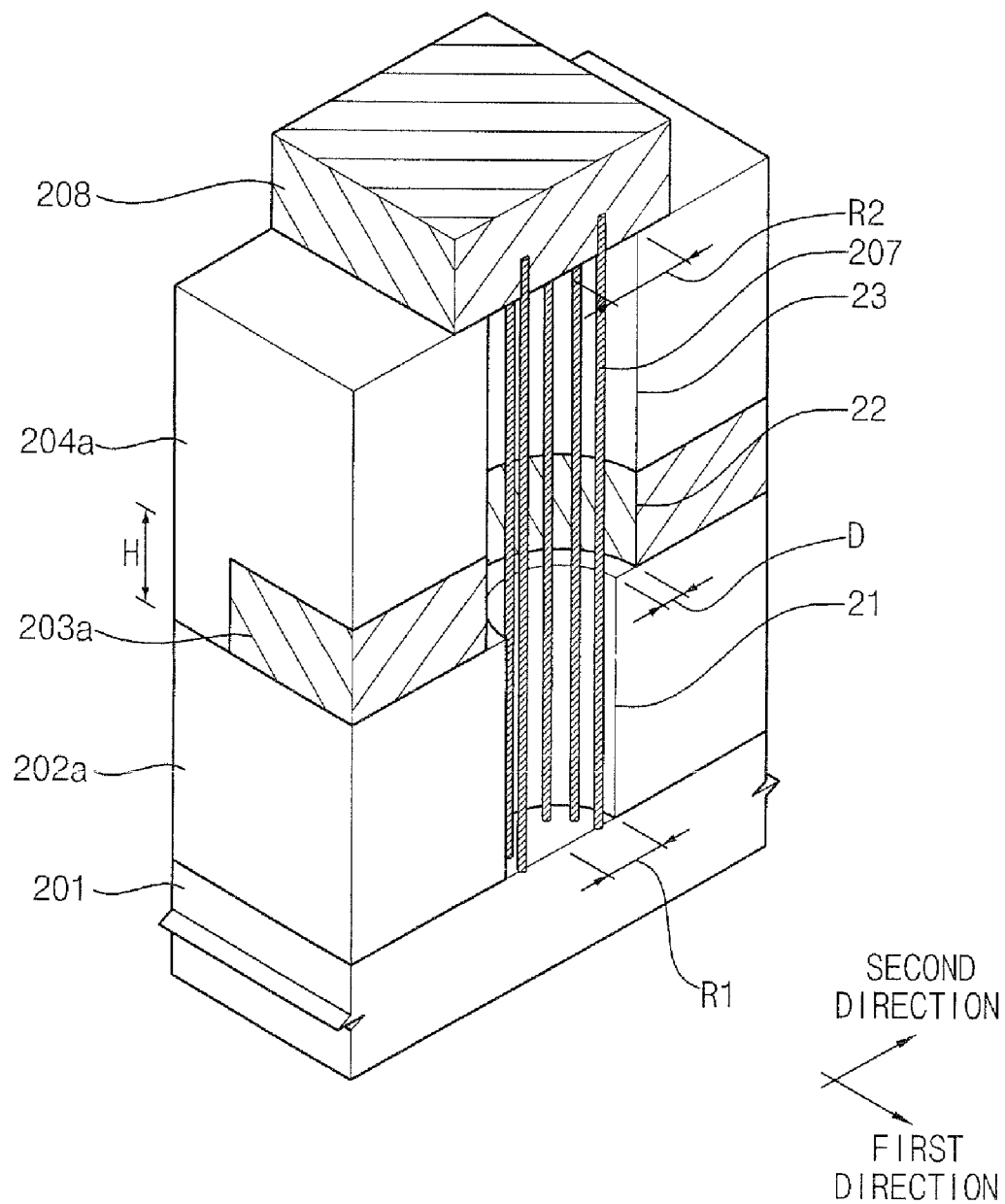

Referring to FIG. 21, a second conductive structure 208 extending in a second direction substantially perpendicular to the first direction is formed on the third insulating layer pattern 204a. The second conductive structure 208 may include a conductive material such as a metal, alloy, or doped polysilicon, thereby manufacturing a transistor 200, for example. Here, an upper end of the carbon nano-tube 207 may be fixed to the second conductive structure 208.

Hereinafter, an operation of the transistor 200 in FIG. 14 is described using FIGS. 22 to 23, which are partially cut perspective views.

Figure 22:
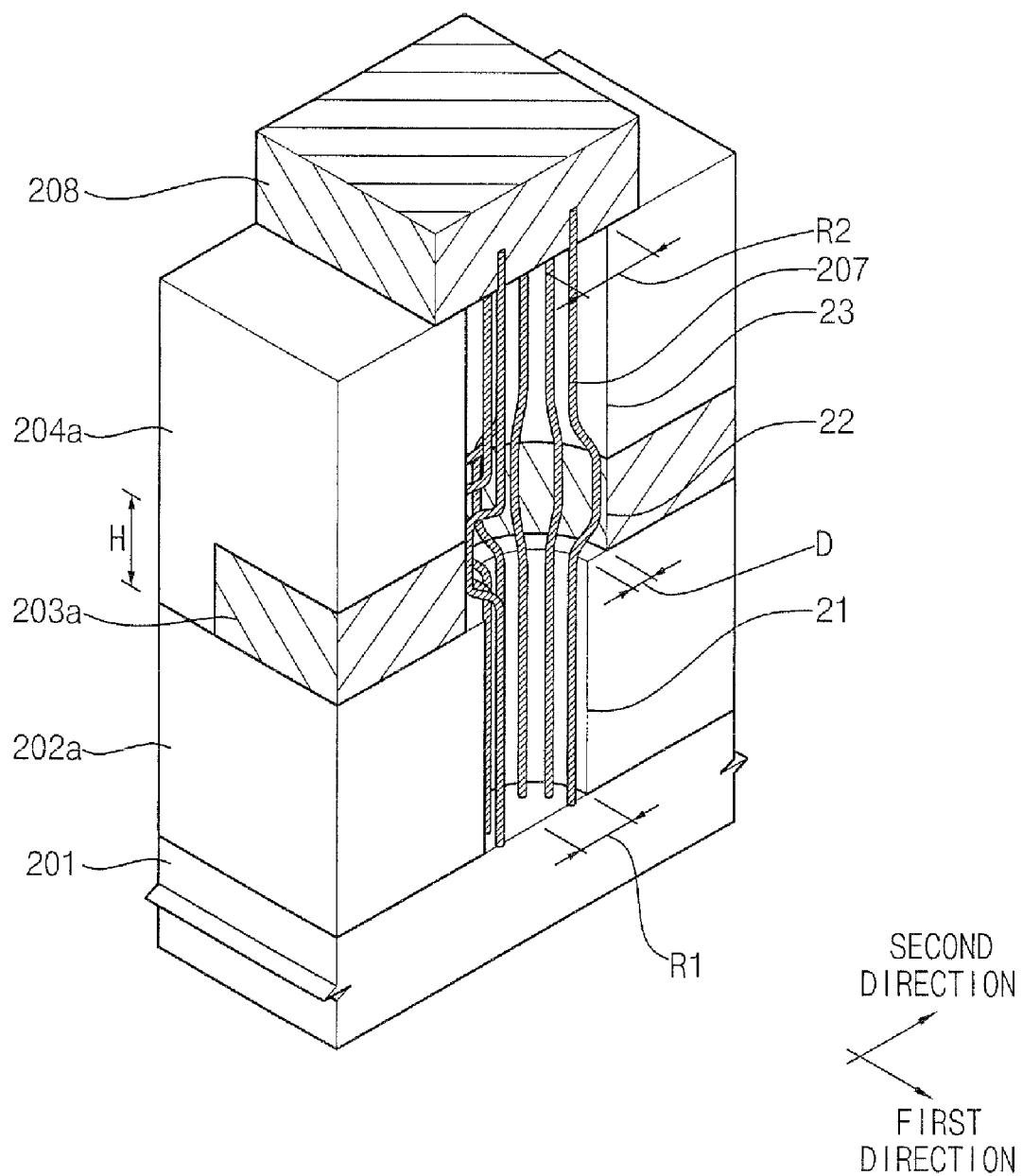
FIGS. 22 to 23 are perspective views illustrating an operation of the transistor in FIG. 14.

Referring to FIG. 22, different bias voltage polarities may be applied to the first conductive structure 203a and the second conductive structure pattern 208, respectively. In this case, an electrostatic attraction is generated between the first conductive structure pattern 203a and the carbon nano-tube 207. If the electrostatic attraction is larger than a predetermined energy barrier, the carbon nano-tube 207 may be attached to the first conductive structure pattern 203a. This state may be defined as an "on" state.

Here, the energy barrier may be determined by not only an inherent elasticity of the carbon nano-tube 207 but also a height H of the first conductive structure pattern 203a, a distance D between the carbon nano-tube 207, the first conductive structure pattern 203a, and so on.

Particularly, the distance D between the carbon nano-tube 207 and the first conductive structure pattern 203a is the width D of the lower end of the spacer 206. Thus, the operation voltage of the transistor 200 may be effectively adjusted by controlling a formation of the spacer 206.

Figure 23:
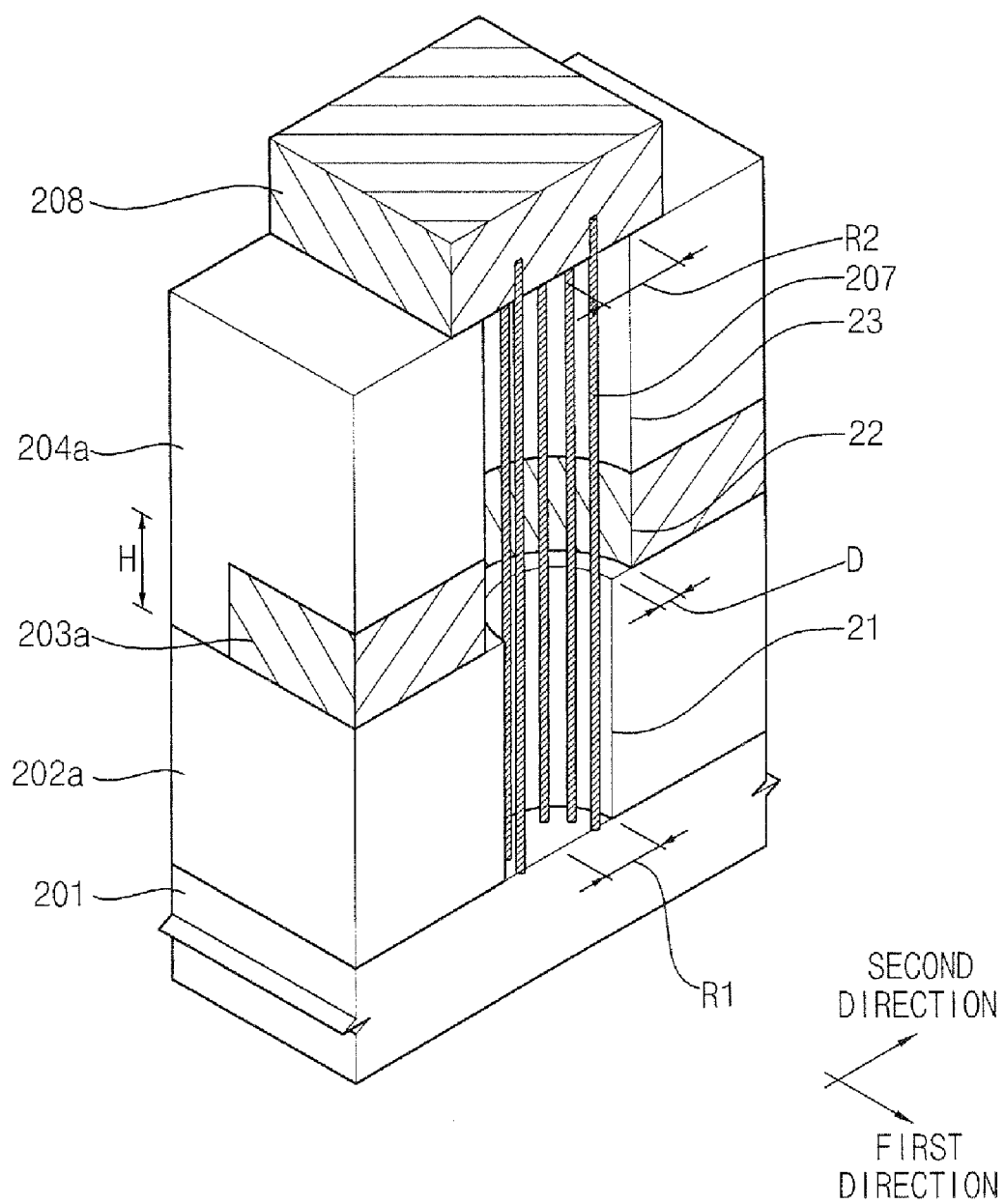

Referring to FIG. 23, bias voltages having the same polarity may be applied to the second conductive structure 208 and the first conductive structure pattern 203a, respectively. In this case, an electrostatic repulsion may be generated between the first conductive structure 203a and the carbon nano-tube 207. If the electrostatic repulsion is larger than the inherent elasticity of the carbon nano-tube 207, the carbon nano-tube 207 may be spaced apart from the first conductive structure pattern 203a. This state may be defined as an "off" state. The transistor 200 may have a switching function by using a difference between the "on" state and the "off" state, for example.

According to the present invention, a space between a carbon nano-tube and a conductor is formed by removing a spacer. Thus, a stability of processes may be achieved. In addition, a dimension of the spacer between the carbon nano-tube and the conductor may be efficiently controlled by adjusting a width of the spacer. Thus, an operation voltage relating to the dimension of the space may be efficiently controlled.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A transistor comprising:
    a first insulating layer pattern provided on a first conductive structure, the first insulating layer pattern defining a first hole exposing the first conductive structure, the first hole having a first radius;
    a second conductive structure pattern provided on the first insulating layer pattern, the second conductive structure pattern defining a second hole communicating with the first hole, the second hole having a second radius substantially larger than the first radius;
    a second insulating layer pattern provided on the first insulating layer pattern and the second conductive structure pattern, the second insulating layer pattern defining a third hole communicating with the second hole, the third hole having the second radius; and
    a carbon nano-tube vertically grown from a portion of the first conductive structure exposed through the first hole.

2. The transistor of claim 1, further comprising a capping layer provided on the second insulating layer pattern to fix an upper end of the carbon nano-tube.

3. The transistor of claim 1, wherein the second hole is completely enclosed by the second conductive structure pattern.

4. The transistor of claim 1, wherein the second hole is partially enclosed by the second conductive structure pattern, the second hole being defined by the second conductive structure pattern and the second insulating layer pattern.

5. The transistor of claim 1, wherein the first conductive structure extends in a first direction and the second conductive structure pattern extends in a second direction substantially perpendicular to the first direction.

6. A transistor comprising:
    a first insulating layer;
    a second insulating layer pattern provided on the first insulating layer, the second insulating layer pattern defining a first hole exposing the first insulating layer, the first hole having a first radius;
    a first conductive structure pattern provided on the second insulating layer pattern, the first conductive structure pattern defining a second hole having a second radius substantially larger than the first radius;
    a third insulating layer pattern provided on the second insulating layer pattern and the first conductive structure pattern, the third insulating layer pattern defining a third hole communicating with the first hole, the third hole having the second radius;
    a carbon nano-tube vertically grown from a portion of the first insulating layer exposed through the first hole; and
    a second conductive structure provided on the third insulating layer pattern to fix an upper end of the carbon nano-tube.

7. The transistor of claim 6, wherein the second hole is fully enclosed by the first conductive structure pattern.

8. The transistor of claim 6, wherein the second hole is partially enclosed by the first conductive structure pattern, the second hole being defined by the first conductive structure pattern and the third insulating layer pattern.

9. The transistor of claim 6, wherein the first conductive structure pattern extends in a first direction and the second conductive structure extends in a second direction substantially perpendicular to the first direction.

10. A method of manufacturing a transistor, the method comprising:
    forming a first insulating layer on a first conductive structure;
    forming a second conductive structure on the first insulating layer;
    forming a second insulating layer on the first insulating layer and the second conductive structure;
    etching the second insulating layer and the second conductive structure to form a second insulating layer pattern and a second conductive structure pattern, the second insulating layer pattern defining a first hole having a first radius, the second conductive structure pattern defining a second hole having the first radius;
    forming a spacer on inner walls of the first hole and the second hole;
    performing an etching process on the first insulating layer by using the spacer as an etch mask to form a first insulating layer pattern defining a third hole communicating with the second hole, the third hole having a second radius substantially smaller than the first radius;
    removing the spacer; and
    growing a carbon nano-tube vertically from a portion of the first conductive structure exposed through the first hole.

11. The method of claim 10, further comprising forming a capping layer on the second insulating layer pattern to fix an upper end of the carbon nano-tube.

12. The method of claim 10, wherein the second hole is fully enclosed by the second conductive structure pattern.

13. The method of claim 10, wherein the second hole is partially enclosed by the second conductive structure pattern, the second hole being defined by the second conductive structure pattern and the second insulating layer pattern.

14. The method of claim 10, wherein the first conductive structure extends in a first direction and the second conductive structure extends in a second direction substantially perpendicular to the first direction.

15. A method of manufacturing a transistor, the method comprising:
    sequentially forming a first insulating layer and a second insulating layer;
    forming a first conductive structure on the second insulating layer;
    forming a third insulating layer on the second insulating layer and the first conductive structure;
    etching the third insulating layer and the first conductive structure to form a third insulating layer pattern and a first conductive structure pattern, the third insulating layer pattern defining a first hole having a first radius, the first conductive structure pattern defining a second hole communicating with the first hole, the second hole having the first radius;

forming a spacer on inner walls of the first hole and the second hole;

performing an etching process on the second insulating layer by using the spacer as an etch mask to form a second insulating layer pattern defining a third hole communicating with the second hole, the third hole having a second radius substantially smaller than the first radius;

removing the spacer;

growing a carbon nano-tube vertically from a portion of the first insulating layer exposed through the third hole; and forming a second conductive structure on the third insulating layer pattern to fix an upper end of the carbon nano-tube.

16. The method of claim 15, wherein the second hole is fully enclosed by the first conductive structure pattern.

17. The method of claim 15, wherein the second hole is partially enclosed by the first conductive structure pattern, the second hole being defined by the first conductive structure pattern and the third insulating layer pattern.

18. The method of claim 15, wherein the first conductive structure extends in a first direction and the second conductive structure extends in a second direction substantially perpendicular to the first direction.

19. The method of claim 15, wherein growing the carbon nano-tube comprises forming a seed that includes nickel, iron, or cobalt.

20. The method of claim 15, wherein a height of the carbon nano-tube is substantially larger than that of the third insulating layer.

* * * * *